(12) United States Patent
Ishima et al.

(10) Patent No.: US 11,705,276 B2
(45) Date of Patent: Jul. 18, 2023

(54) METHOD FOR MANUFACTURING ELECTRONIC-COMPONENT

(71) Applicant: TDK CORPORATION, Tokyo (JP)

(72) Inventors: Yuya Ishima, Tokyo (JP); Shinichi Kondo, Tokyo (JP); Kosuke Ito, Tokyo (JP); Shingo Hattori, Tokyo (JP)

(73) Assignee: TDK CORPORATION, Tokyo (JP)

( * ) Notice: Subject to any disclaimer, the term of this patent is extended or adjusted under 35 U.S.C. 154(b) by 373 days.

(21) Appl. No.: 17/010,427

(22) Filed: Sep. 2, 2020

(65) Prior Publication Data

US 2021/0074474 A1 Mar. 11, 2021

(30) Foreign Application Priority Data

Sep. 6, 2019 (JP) ................................ 2019-163078

(51) Int. Cl.
| | |
|---|---|
| *H01F 41/04* | (2006.01) |
| *H01F 17/00* | (2006.01) |
| *H05K 3/46* | (2006.01) |
| *H01F 27/29* | (2006.01) |
| *H01F 41/02* | (2006.01) |
| *H05K 1/16* | (2006.01) |

(52) U.S. Cl.
CPC ....... *H01F 41/041* (2013.01); *H01F 17/0013* (2013.01); *H01F 27/292* (2013.01); *H01F 41/0233* (2013.01); *H05K 1/165* (2013.01); *H05K 3/46* (2013.01)

(58) Field of Classification Search
CPC ............... H01F 17/0013; H01F 27/292; H01F 41/0233; H01F 41/041; H05K 1/165; H05K 3/46; H05K 3/4664
See application file for complete search history.

(56) References Cited

U.S. PATENT DOCUMENTS

| | | | |
|---|---|---|---|
| 2006/0091534 A1 | 5/2006 | Ohba et al. | |
| 2014/0224418 A1 | 8/2014 | Seko | |
| 2018/0254145 A1 | 9/2018 | Ishima et al. | |
| 2019/0043655 A1* | 2/2019 | Kato | ................... H01F 17/0013 |

(Continued)

FOREIGN PATENT DOCUMENTS

| | | |
|---|---|---|
| CN | 108538570 A | 9/2018 |
| JP | 2005-123507 A | 5/2005 |

(Continued)

*Primary Examiner* — Minh N Trinh
(74) *Attorney, Agent, or Firm* — Oliff PLC

(57) ABSTRACT

A method for manufacturing an electronic-component includes a step of forming a laminate substrate including a plurality of laminates disposed in a direction intersecting with a lamination direction via a division portion by laminating a plurality of insulator layers, and a step of singulating the plurality of laminates by removing the division portion. The step of forming the laminate substrate includes a step of forming an insulator resist layer containing an insulating material on a base material, the insulating material being a constituent material of each of the insulator layers and a step of forming the insulator layer by curing the insulator resist layer by exposure, except for at least an insulator resist portion corresponding to the division portion. The division portion including the insulator resist portion is removed by development in the step of singulating.

7 Claims, 14 Drawing Sheets

(56) References Cited

U.S. PATENT DOCUMENTS

2021/0074474 A1* 3/2021 Ishima ................ H01F 41/0233
2022/0293339 A1* 9/2022 Ishima .................... H01F 41/12

FOREIGN PATENT DOCUMENTS

| | | |
|---|---|---|
| JP | 2005-123508 A | 5/2005 |
| JP | 2005-123509 A | 5/2005 |
| JP | 2005-277008 A | 10/2005 |
| JP | 2005-302796 A | 10/2005 |
| JP | 2006-173160 A | 6/2006 |
| JP | 2014-154716 A | 8/2014 |

* cited by examiner

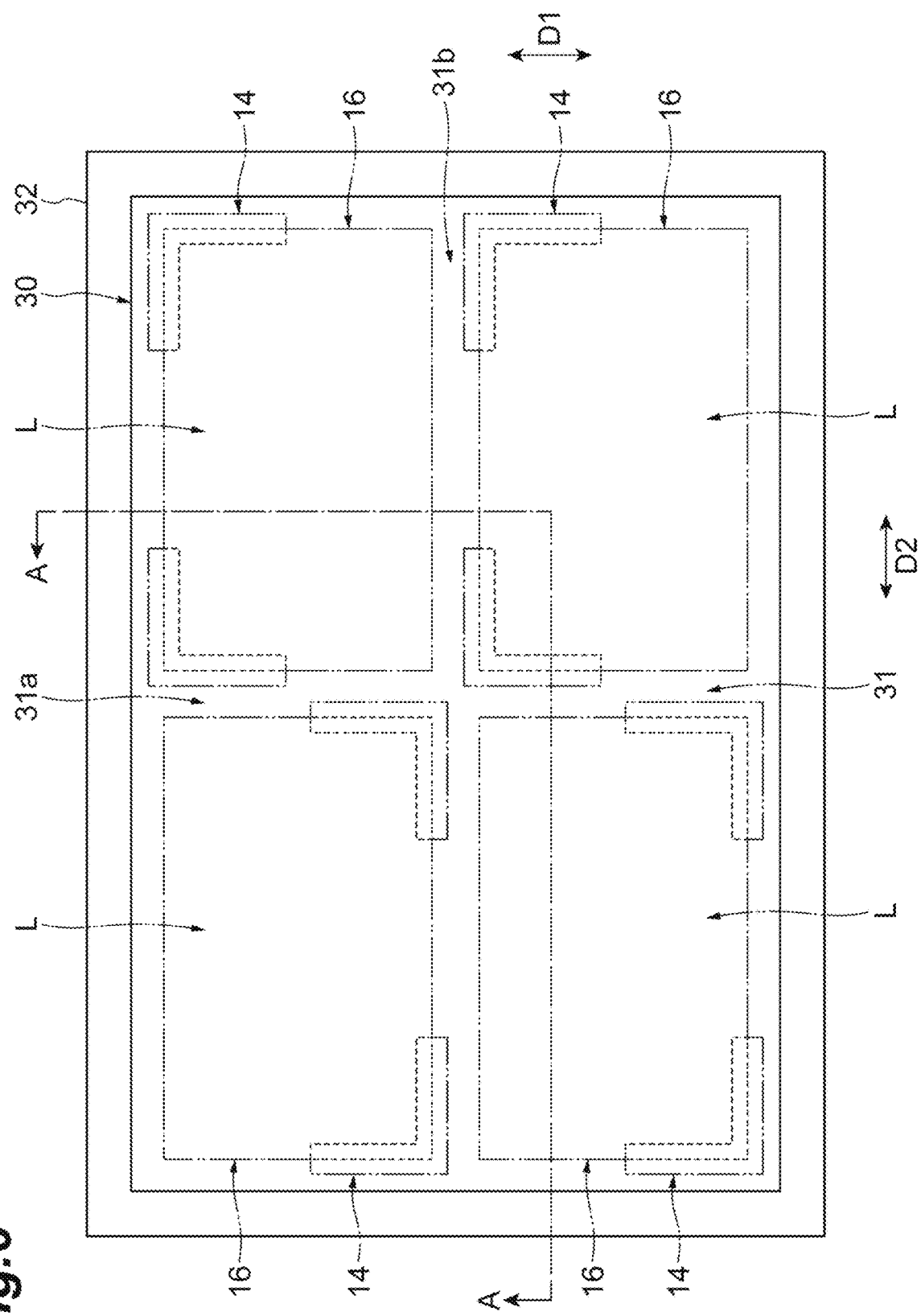

METHOD FOR MANUFACTURING ELECTRONIC-COMPONENT

TECHNICAL FIELD

The present disclosure relates to a method for manufacturing an electronic-component.

BACKGROUND

Japanese Unexamined Patent Publication No. 2014-154716 discloses a method for manufacturing an electronic-component including a step of cutting a mother laminate into a plurality of laminates. In the mother laminate, the assembled conductor is more difficult to cut than the insulator layer. Thus, when the mother laminate is cut along the cut line where the assembled conductor is disposed, a large cutting stress applied to the assembled conductor passes through the entire mother laminate, and the laminates are easily deformed. In the manufacturing method disclosed in Japanese Unexamined Patent Publication No. 2014-154716, the deformation of the laminates is suppressed by firstly cutting the mother laminate along the cut line where the assembled conductor is not disposed.

SUMMARY

One aspect of the present disclosure provides a method for manufacturing an electronic-component capable of further suppressing deformation of an electronic component.

A method for manufacturing an electronic-component according to an aspect of the present disclosure includes a step of forming, by laminating a plurality of insulator layers, a laminate substrate including a plurality of laminates disposed in a direction intersecting with a lamination direction via a division portion, and a step of singulating, by removing the division portion, the plurality of laminates, in which the step of forming the laminate substrate includes a step of forming, on a base material, an insulator resist layer containing an insulating material, the insulating material being a constituent material of each insulator layer, and a step of forming the insulator layer by curing, expect for at least an insulator resist portion corresponding to the division portion, the insulator resist layer by exposure, the laminate substrate is formed by repeating, on the base material, the step of forming the insulator resist layer and the step of forming the insulator layer in the step of forming the laminate substrate, and the division portion including the insulator resist portion is removed by development in the step of singulating.

In this method, the division portion of the laminate substrate is removed by development, and the plurality of laminates is singulated. Thus, although the conductor in contact with the division portion is provided in each laminate, the deformation of the laminate is further suppressed. In addition, the division portion including the insulator resist portion is removed after the plurality of insulator layers is laminated and the laminate substrate is formed. Thus, it is possible to improve the planarity of the laminated insulator resist layer. As a result, the deterioration of the shape of each laminate is suppressed.

In the step of forming the laminate substrate, the laminate substrate may be formed in such a way that the division portion has a width of 5 μm or more and 20 μm or less. In this case, since the width of the division portion is 5 μm or more, it is possible to remove the division portion by the adjusted development process to singulate the plurality of laminates. Since the width of the division portion is 20 μm or less, it is possible to reduce the contact area of the insulator resist portion with a developing solution although the insulator resist portion is exposed to the developing solution in forming the laminate substrate. Thus, it is possible to suppress the removal of the insulator resist portion in the adjusted development process in forming the laminate substrate.

The step of forming the laminate substrate further includes a step of forming a conductor resist layer containing a conductive material, the conductive material being a constituent material of a conductor provided in each laminate, and a step of forming the conductor from the conductor resist layer by exposure and development, and the insulator resist layer may be formed in such a way as to embed the conductor in the step of forming the insulator resist layer. Thus, it is possible to provide the conductor in each laminate.

BRIEF DESCRIPTION OF THE DRAWINGS

FIG. 6 is a top view of a laminate substrate;

DETAILED DESCRIPTION

Hereinafter, an embodiment will be described in detail with reference to the accompanying drawings. In the description of the drawings, identical or equivalent elements are denoted by the same reference signs, and overlapped descriptions are omitted.

(Electronic Component)

Figure 1:
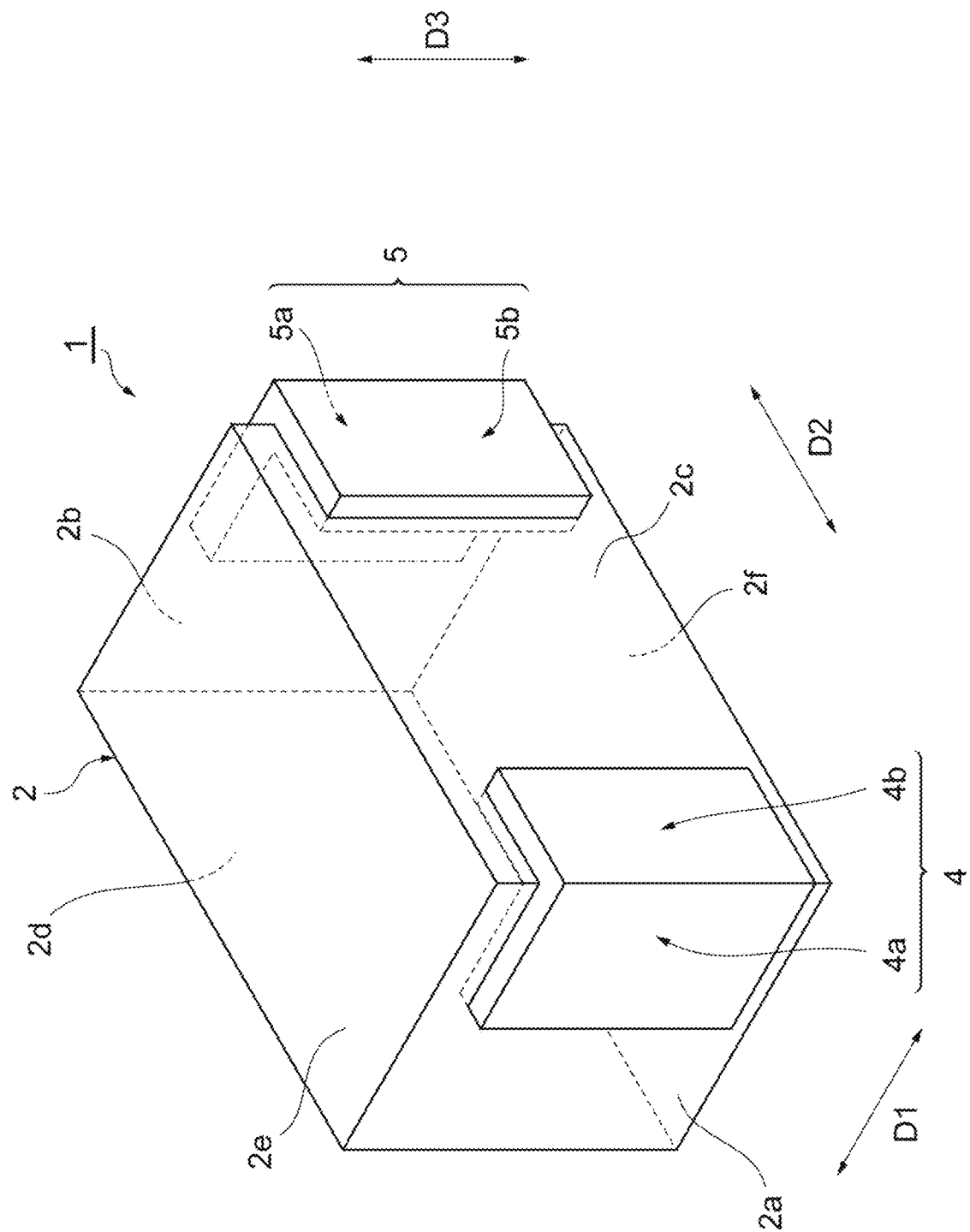
FIG. 1 is a perspective view of an electronic component according to an embodiment.

As shown in FIG. 1, an electronic component 1 includes an element body 2 having a rectangular parallelepiped shape and a plurality (in this specification, a pair) of terminal electrodes 4 and 5. The pair of terminal electrodes 4 and 5 is disposed at both end portions of the element body 2. The rectangular parallelepiped shape includes a rectangular parallelepiped shape in which the corner portions and the ridge portions are chamfered, and a rectangular parallelepiped shape in which the corner portions and the ridge portions are rounded. In the present embodiment, the electronic component 1 is, for example, a laminated coil component.

The element body 2 has, as outer surfaces, a pair of end faces 2a and 2b opposed to each other, a pair of main faces 2c and 2d opposed to each other, and a pair of side faces 2e and 2f opposed to each other. In the following description, it is assumed that the direction in which the pair of main faces 2c and 2d is opposed is a first direction D1, that the direction in which the pair of end faces 2a and 2b is opposed is a second direction D2, and that the direction in which the pair of side faces 2e and 2f is opposed is a third direction D3. In the present embodiment, the first direction D1 is the height direction of the element body 2. The second direction D2 is the length direction of the element body 2 and is orthogonal to the first direction D1. The third direction D3 is the width direction of the element body 2 and is orthogonal to the first direction D1 and the second direction D2.

The pair of end faces 2a and 2b extends in the first direction D1 in such a way as to connect the pair of main faces 2c and 2d. The pair of end faces 2a and 2b also extends in the third direction D3, that is, in the short side direction of the pair of main faces 2c and 2d. The pair of side faces 2e and 2f extends in the first direction D1 in such a way as to connect the pair of main faces 2c and 2d. The pair of side faces 2e and 2f also extends in the second direction D2, that is, in the long side direction of the pair of main faces 2c and 2d. The electronic component 1 is, for example, solder-mounted on an electronic device (for example, a circuit board or an electronic component).

In the electronic component 1, the main face 2c constitutes a mounting surface opposed to the electronic device. The pair of end faces 2a and 2b is adjacent to the main face 2c. The length of the electronic component 1 in the first direction D1 (the height) is, for example, 0.05 mm or more and 1.000 mm or less. The length of the electronic component 1 in the second direction D2 (the length) is, for example, 0.10 mm or more and 2.000 mm or less. The length of the electronic component 1 in the third direction D3 (the width) is, for example, 0.05 mm or more and 1.000 mm or less.

Figure 2:
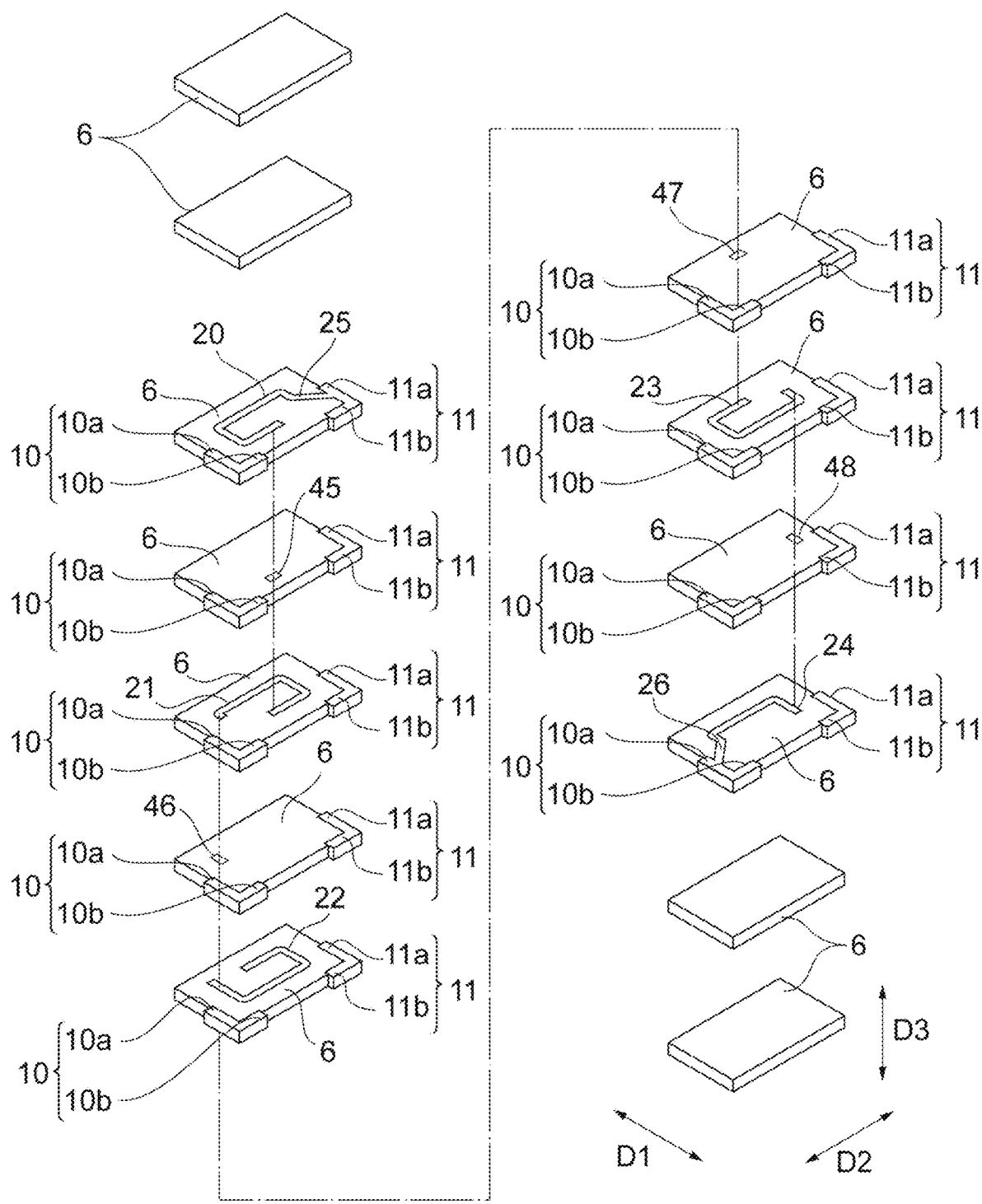
FIG. 2 is an exploded perspective view of the electronic component in FIG. 1.

As shown in FIG. 2, the element body 2 is formed by laminating a plurality of element-body layers 6 in the third direction D3. The element body 2 includes the laminated element-body layers 6. In the element body 2, the lamination direction in which the element-body layers 6 are laminated is aligned with the third direction D3. As to be described later, some of the element-body layers 6 are formed in such a way as to be integrated with the element-body layers 6 adjacent in the lamination direction. In the actual element body 2, the element-body layers 6 formed as separate bodies are integrated in such a way that no boundaries between the respective element-body layers 6 can be visually recognized.

Each element-body layer 6 contains, for example, a cured product of a negative photosensitive material and an insulating material. The negative photosensitive material includes, for example, acrylic resin. Each element-body layer 6 contains, for example, a magnetic material as the insulating material. The magnetic material includes, for example, Ni—Cu—Zn-based ferrite material, Ni—Cu—Zn—Mg-based ferrite material, Ni—Cu-based ferrite material, or Fe alloy. Each element-body layer 6 may contain, for example, a non-magnetic material as the insulating material. The non-magnetic material includes, for example, glass ceramic material or dielectric material. Each element-body layer 6 may be formed after, for example, a firing step of firing an insulator layer containing the insulating material, and may contain a sintered body of the insulating material.

Figure 3:
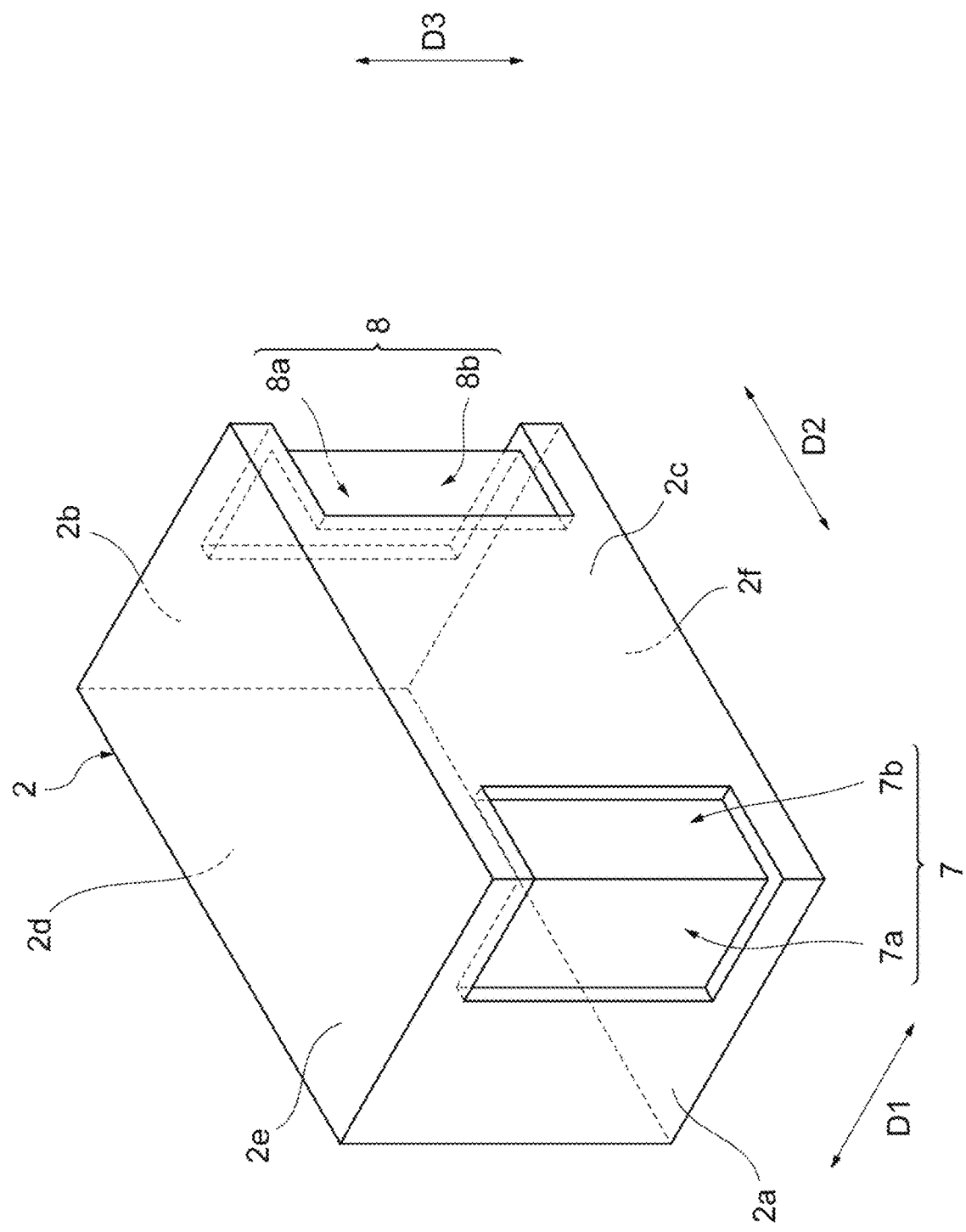
FIG. 3 is a perspective view of an element body in FIG. 1.

As shown in FIG. 3, depressions 7 and 8 are provided on the outer surfaces of the element body 2. The depressions 7 and 8 are spaces depressed inward from the outer surfaces of the element body 2. The depressions 7 and 8 each have an L shape when viewed from the third direction D3. The depressions 7 and 8 are apart from each other in the second direction D2.

The depression 7 is provided on the end face 2a side of the element body 2. The depression 7 includes an end-face depression 7a provided on the end face 2a and a main-face depression 7b provided on the main face 2c. The end-face depression 7a and the main-face depression 7b are integrally provided. The end-face depression 7a is disposed on the main face 2c side of the end face 2a. The bottom face of the end-face depression 7a is parallel to the end faces 2a and 2b. The bottom face of the main-face depression 7b is parallel to the main faces 2c and 2d.

The depression 8 is provided on the end face 2b side of the element body 2. The depression 8 includes an end-face depression 8a provided on the end face 2b and a main-face depression 8b provided on the main face 2c. The end-face depression 8a and the main-face depression 8b are integrally provided. The end-face depression 8a is disposed on the main face 2c side of the end face 2b. The bottom face of the end-face depression 8a is parallel to the end faces 2a and 2b. The bottom face of the main-face depression 8b is parallel to the main faces 2c and 2d.

As shown in FIG. 1, the pair of terminal electrodes 4 and 5 is apart from each other in the second direction D2. The terminal electrodes 4 and 5 each have an L shape when viewed from the third direction D3. Each of the terminal electrodes 4 and 5 contains, for example, a conductive material. The conductive material contains, for example, Ag or Pd. The conductive material contains, for example, metal powder, such as Ag powder or Pd powder. The surface of each of the terminal electrodes 4 and 5 may be formed with a plating layer. The plating layer is formed by, for example, electroplating or electroless plating. The plating layer contains, for example, Ni, Sn, or Au.

The terminal electrode 4 is disposed on the end face 2a side of the element body 2. The terminal electrode 4 is disposed from the end face 2a to the main face 2c. The terminal electrode 4 is provided in the depression 7 (see FIG. 3). The terminal electrode 4 includes an electrode portion 4a provided in the end-face depression 7a (see FIG. 3) and an electrode portion 4b provided in the main-face depression 7b (see FIG. 3). The electrode portions 4a and 4b are integrally provided. The electrode portions 4a and 4b are connected to each other at the ridge portion of the element body 2 and are electrically connected to each other.

The electrode portion 4a extends along the first direction D1. The electrode portion 4a has a rectangular shape when viewed from the second direction D2. The electrode portion 4a is away from the main face 2d, the side face 2e, and the side face 2f when viewed from the second direction D2. The electrode portion 4b extends along the second direction D2. The electrode portion 4b has a rectangular shape when viewed from the first direction D1. The electrode portion 4b is away from the end face 2b, the side face 2e, and the side face 2f when viewed from the first direction D1. Each of the electrode portions 4a and 4b extends along the third direction D3.

The terminal electrode 5 is disposed on the end face 2b side of the element body 2. The terminal electrode 5 is disposed from the end face 2b to the main face 2c. The terminal electrode 5 is provided in the depression 8 (see FIG. 3). The terminal electrode 5 includes an electrode portion 5a provided in the end-face depression 8a (see FIG. 3) and an electrode portion 5b provided in the main-face depression 8b (see FIG. 3). The electrode portions 5a and 5b are integrally provided. The electrode portions 5a and 5b are connected to each other at the ridge portion of the element body 2 and are electrically connected to each other.

The electrode portion 5a extends along the first direction D1. The electrode portion 5a has a rectangular shape when viewed from the second direction D2. The electrode portion 5a is away from the main face 2d, the side face 2e, and the side face 2f when viewed from the second direction D2. The electrode portion 5b extends along the second direction D2. The electrode portion 5b has a rectangular shape when viewed from the first direction D1. The electrode portion 5b is away from the end face 2a, the side face 2e, and the side face 2f when viewed from the first direction D1. Each of the electrode portions 5a and 5b extends along the third direction D3.

Figure 4:
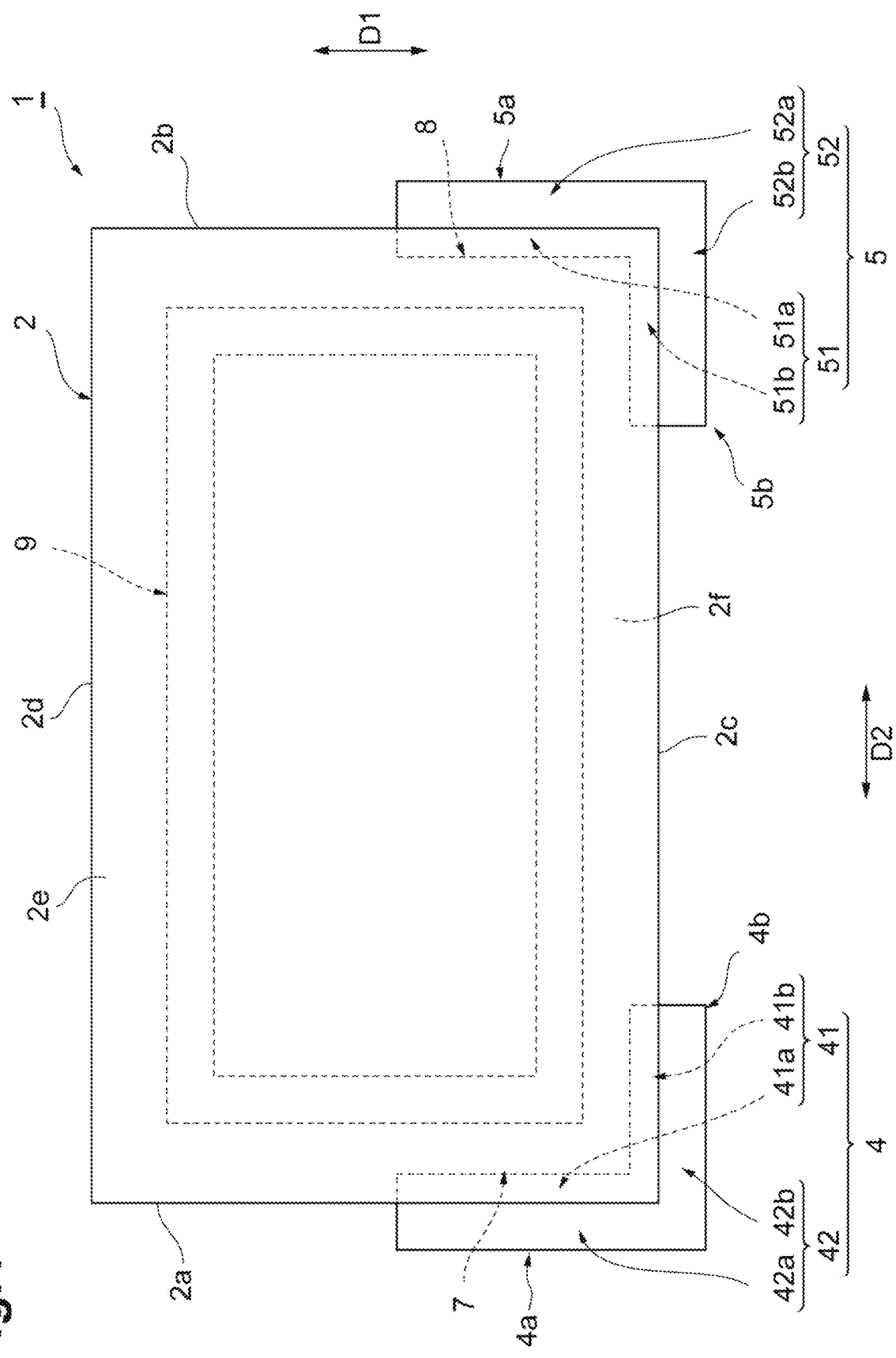
FIG. 4 is a top view of the electronic component in FIG. 1.

As shown in FIG. 4, the terminal electrode 4 includes an electrode portion 41 disposed inside the depression 7 and an electrode portion 42 disposed outside the depression 7. In the present embodiment, the terminal electrode 4 is formed by the electrode portion 41 and the electrode portion 42. The electrode portion 41 is embedded in the depression 7. The electrode portion 41 has a shape corresponding to the shape of the depression 7. The electrode portion 42 protrudes from the depression 7. The electrode portions 41 and 42 are integrally provided. The electrode portions 41 and 42 are adjacent to each other in the thickness direction of the terminal electrode 4.

The electrode portion 41 includes an electrode portion 41a embedded in the end-face depression 7a and an electrode portion 41b embedded in the main-face depression 7b. The electrode portion 41a has a shape corresponding to the end-face depression 7a. The electrode portion 41a is embedded in the end-face depression 7a and is positioned further inside the element body 2 than the end face 2a. The electrode portion 41b has a shape corresponding to the main-face depression 7b. The electrode portion 41b is embedded in the main-face depression 7b and is positioned further inside the element body 2 than the main face 2c. The electrode portions 41a and 41b are integrally provided. The electrode portions 41a and 41b are connected to each other at the ridge portion of the element body 2 and are electrically connected to each other.

The electrode portion 42 includes an electrode portion 42a protruding from the end-face depression 7a and an electrode portion 42b protruding from the main-face depression 7b. The electrode portion 42a protrudes from the end face 2a and is positioned further outside the element body 2 than the end face 2a. The electrode portion 42b protrudes from the main face 2c and is positioned further outside the element body 2 than the main face 2c. The electrode portions 42a and 42b are integrally provided. The electrode portions 42a and 42b are connected to each other at the ridge portion of the element body 2 and are electrically connected to each other. The electrode portions 41a and 42a form the electrode portion 4a. The electrode portions 41b and 42b form the electrode portion 4b.

As shown in FIG. 2, the terminal electrode 4 is formed by laminating a plurality of electrode layers 10 in the third direction D3. In the present embodiment, the terminal electrode 4 includes a plurality of laminated electrode layers 10. Each electrode layer 10 is provided in such a way as to be embedded in the corresponding element-body layer 6. The element-body layer 6 includes a defect portion corresponding to the shape of the electrode layer 10. As to be described later, some of the electrode layers 10 are formed in such a way as to be integrated with the electrode layers 10 adjacent in the lamination direction. In the actual terminal electrode 4, the electrode layers 10 formed as separate bodies are integrated in such a way that no boundaries between the respective electrode layers 10 can be visually recognized. Due to the defective portions formed in the element-body layers 6, the depression 7 in which the terminal electrode 4 is to be disposed is obtained in the element body 2.

Each electrode layer 10 has an L shape when viewed from the third direction D3. Each electrode layer 10 includes a plurality of layer portions 10a and 10b. In the present embodiment, each electrode layer 10 includes a pair of layer portions 10a and 10b. Each layer portion 10a extends along the first direction D1. Each layer portion 10b extends along the second direction D2. The electrode portion 4a is formed by laminating the layer portions 10a of the respective electrode layers 10. In the electrode portion 4a, the layer portions 10a are integrated in such a way that no boundaries between the respective layer portions 10a can be visually recognized. The electrode portion 4b is formed by laminating the layer portions 10b of the respective electrode layers 10. In the electrode portion 4b, the layer portions 10b are integrated in such a way that no boundaries between the respective layer portions 10b can be visually recognized.

As shown in FIG. 4, the terminal electrode 5 includes an electrode portion 51 disposed inside the depression 8 and an electrode portion 52 disposed outside the depression 8. In the present embodiment, the terminal electrode 5 is formed by the electrode portion 51 and the electrode portion 52. The electrode portion 51 is embedded in the depression 8. The electrode portion 51 has a shape corresponding to the shape of the depression 8. The electrode portion 52 protrudes from the depression 8. The electrode portions 51 and 52 are integrally provided. The electrode portions 51 and 52 are adjacent to each other in the thickness direction of the terminal electrode 5.

The electrode portion 51 includes an electrode portion 51a embedded in the end-face depression 8a and an electrode portion 51b embedded in the main-face depression 8b. The electrode portion 51a has a shape corresponding to the end-face depression 8a. The electrode portion 51a is embedded in the end-face depression 8a and is positioned further inside the element body 2 than the end face 2b. The electrode portion 51b has a shape corresponding to the main-face depression 8b. The electrode portion 51b is embedded in the main-face depression 8b and is positioned further inside the element body 2 than the main face 2c. The electrode portions 51a and 51b are integrally provided. The electrode portions 51a and 51b are connected to each other at the ridge portion of the element body 2 and are electrically connected to each other.

The electrode portion 52 includes an electrode portion 52a protruding from the end-face depression 8a and an electrode portion 52b protruding from the main-face depression 8b. The electrode portion 52a protrudes from the end face 2b and is positioned further outside the element body 2 than the end face 2b. The electrode portion 52b protrudes from the main face 2c and is positioned further outside the element body 2 than the main face 2c. The electrode portions 52a and 52b are integrally provided. The electrode portions 52a and 52b are connected to each other at the ridge portion of the element body 2 and are electrically connected to each other. The electrode portions 51a and 52a form the electrode portion 5a. The electrode portions 51b and 52b form the electrode portion 5b.

The electrode portion 52 is thicker than the electrode portion 51. That is, the protruding amount of the terminal electrode 5 protruding from the depression 8 (hereinafter, the protruding amount of the terminal electrode 5) is larger than the embedded amount of the terminal electrode 5 embedded in the depression 8 (hereinafter, the embedded amount of the terminal electrode 5). The protruding amount of the terminal electrode 5 can be the maximum value, that is, the protruding amount of the highest portion of the terminal electrode 5 protruding from the depression 8. The embedded amount of the terminal electrode 5 can be the maximum value, that is, the embedded amount of the deepest portion of the terminal electrode 5 embedded in the depression 8.

The protruding amount and the embedded amount of the terminal electrode 5 can be measured as follows, for example. First, a cross-sectional view of the electronic component 1 taken along a plane orthogonal to the third direction D3 is acquired. The cross section at this time can be, for example, a plane that is orthogonal to the third direction D3 and positioned equidistant from the pair of side faces 2e and 2f. Then, by performing image analysis on the acquired cross-sectional view, the protruding amount and the embedded amount of the terminal electrode 5 are measured. Each of the protruding amount and the embedded amount of the terminal electrode 5 may be, for example, an average value of a plurality of measurement results obtained from a plurality of cross-sectional views orthogonal to the third direction D3.

The electrode portion 52a is thicker than the electrode portion 51a, and the electrode portion 52b is thicker than the electrode portion 51b. That is, the protruding amount of the electrode portion 5a protruding from the end-face depression 8a is larger than the embedded amount of the electrode portion 5a embedded in the end-face depression 8a, and the protruding amount of the electrode portion 5b protruding from the main-face depression 8b is larger than the embedded amount of the electrode portion 5b embedded in the main-face depression 8b. In other words, the length of the electrode portion 52a in the second direction D2 is longer than the length of the electrode portion 51a in the second direction D2, and the length of the electrode portion 52b in the first direction D1 is longer than the length of the electrode portion 51b in the first direction D1.

As shown in FIG. 2, the terminal electrode 5 is formed by laminating a plurality of electrode layers 11 in the third direction D3. In the present embodiment, the terminal electrode 5 includes a plurality of laminated electrode layers 11. Each electrode layer 11 is provided in such a way as to be embedded in the corresponding element-body layer 6. The element-body layer 6 includes a defect portion corresponding to the shape of the electrode layer 10. As to be described later, some of the electrode layers 11 are formed in such a way as to be integrated with the electrode layers 11 adjacent in the lamination direction. In the actual terminal electrode 5, the electrode layers 11 formed as separate bodies are integrated in such a way that no boundaries between the respective electrode layers 11 can be visually recognized. Due to the defective portions formed in the element-body layers 6, the depression 8 in which the terminal electrode 5 is to be disposed is obtained in the element body 2.

Each electrode layer 11 has an L shape when viewed from the third direction D3. Each electrode layer 11 includes a plurality of layer portions 11a and 11b. In the present embodiment, each electrode layer 11 includes a pair of layer portions 11a and 11b. Each layer portion 11a extends along the first direction D1. Each layer portion 11b extends along the second direction D2. The electrode portion 5a is formed by laminating the layer portions 11a of the respective electrode layers 11. In the electrode portion 5a, the layer portions 11a are integrated in such a way that no boundaries between the respective layer portions 11a can be visually recognized. The electrode portion 5b is formed by laminating the layer portions 11b of the respective electrode layers 11. In the electrode portion 5b, the layer portions 11b are integrated in such a way that no boundaries between the respective layer portions 11b can be visually recognized.

As shown in FIG. 4, the electronic component 1 includes a coil 9 disposed in the element body 2. The coil axis of the coil 9 extends along the third direction D3. The outer shape of the coil 9 has a substantially rectangular shape when viewed from the third direction D3.

As shown in FIG. 2, the coil 9 (see FIG. 4) includes a first coil conductor 20, a second coil conductor 21, a third coil conductor 22, a fourth coil conductor 23, and a fifth coil conductor 24. The first coil conductor 20, the second coil conductor 21, the third coil conductor 22, the fourth coil conductor 23, and the fifth coil conductor 24 are disposed along the third direction D3 in the order of the first coil conductor 20, the second coil conductor 21, the third coil conductor 22, the fourth coil conductor 23, and the fifth coil conductor 24. The first coil conductor 20, the second coil conductor 21, the third coil conductor 22, the fourth coil conductor 23, and the fifth coil conductor 24 each have a substantially rectangular shape in which a part of the loop is disconnected and each include one end and the other end. The first coil conductor 20, the second coil conductor 21, the third coil conductor 22, the fourth coil conductor 23, and the fifth coil conductor 24 each include a portion linearly extending along the first direction D1 and a portion linearly extending along the second direction D2. The first coil conductor 20, the second coil conductor 21, the third coil conductor 22, the fourth coil conductor 23, and the fifth coil conductor 24 are each formed with a predetermined width.

The coil 9 (see FIG. 4) includes a first connecting conductor 45, a second connecting conductor 46, a third connecting conductor 47, and a fourth connecting conductor 48. The first connecting conductor 45, the second connecting conductor 46, the third connecting conductor 47, and the fourth connecting conductor 48 are disposed along the third direction D3 in the order of the first connecting conductor 45, the second connecting conductor 46, the third connecting conductor 47, and the fourth connecting conductor 48. The first connecting conductor 45, the second connecting conductor 46, the third connecting conductor 47, and the fourth connecting conductor 48 each have a substantially rectangular shape when viewed from the third direction D3.

The first coil conductor 20 is positioned in the same layer as one electrode layer 10 and one electrode layer 11. The first coil conductor 20 is connected to the electrode layer 11 via a coupling conductor 25. The coupling conductor 25 is positioned in the same layer as the first coil conductor 20. One end of the first coil conductor 20 is connected to the coupling conductor 25. The coupling conductor 25 is connected to the layer portion 11a. The coupling conductor 25 couples the first coil conductor 20 and the electrode layer 11.

The coupling conductor 25 may be connected to the layer portion 11b. The first coil conductor 20 is away from the electrode layer 10 positioned in the same layer. In the present embodiment, the first coil conductor 20, the coupling conductor 25, and the electrode layer 11 are integrally formed.

The first connecting conductor 45 is disposed in the element-body layer 6 between the first coil conductor 20 and the second coil conductor 21. In the element-body layer 6 in which the first connecting conductor 45 is disposed, one electrode layer 10 and one electrode layer 11 are positioned. The first connecting conductor 45 is away from the electrode layers 10 and 11 positioned in the same layer. The first connecting conductor 45 is disposed in such a way as to overlap the other end of the first coil conductor 20 and one end of the second coil conductor 21 when viewed from the third direction D3. The first connecting conductor 45 is connected to the other end of the first coil conductor 20 and is also connected to the one end of the second coil conductor 21. The first connecting conductor 45 couples the first coil conductor 20 and the second coil conductor 21.

The second coil conductor 21 is positioned in the same layer as one electrode layer 10 and one electrode layer 11. The second coil conductor 21 is away from the electrode layers 10 and 11 positioned in the same layer. The first coil conductor 20 and the second coil conductor 21 are adjacent to each other in the third direction D3 while the element-body layer 6 is interposed between the first coil conductor 20 and the second coil conductor 21. When viewed from the third direction D3, the one end of the second coil conductor 21 overlaps the other end of the first coil conductor 20 via the first connecting conductor 45.

The second connecting conductor 46 is disposed in the element-body layer 6 between the second coil conductor 21 and the third coil conductor 22. In the element-body layer 6 in which the second connecting conductor 46 is disposed, one electrode layer 10 and one electrode layer 11 are positioned. The second connecting conductor 46 is away from the electrode layers 10 and 11 positioned in the same layer. The second connecting conductor 46 is disposed in such a way as to overlap the other end of the second coil conductor 21 and one end of the third coil conductor 22 when viewed from the third direction D3. The second connecting conductor 46 is connected to the other end of the second coil conductor 21 and is also connected to the one end of the third coil conductor 22. The second connecting conductor 46 couples the second coil conductor 21 and the third coil conductor 22.

The third coil conductor 22 is positioned in the same layer as one electrode layer 10 and one electrode layer 11. The third coil conductor 22 is away from the electrode layers 10 and 11 positioned in the same layer. The second coil conductor 21 and the third coil conductor 22 are adjacent to each other in the third direction D3 while the element-body layer 6 is interposed between the second coil conductor 21 and the third coil conductor 22. When viewed from the third direction D3, the one end of the third coil conductor 22 overlaps the other end of the second coil conductor 21 via the second connecting conductor 46.

The third connecting conductor 47 is disposed in the element-body layer 6 between the third coil conductor 22 and the fourth coil conductor 23. In the element-body layer 6 in which the third connecting conductor 47 is disposed, one electrode layer 10 and one electrode layer 11 are positioned. The third connecting conductor 47 is away from the electrode layers 10 and 11 positioned in the same layer. The third connecting conductor 47 is disposed in such a way as to overlap the other end of the third coil conductor 22 and one end of the fourth coil conductor 23 when viewed from the third direction D3. The third connecting conductor 47 is connected to the other end of the third coil conductor 22 and is also connected to the one end of the fourth coil conductor 23. The third connecting conductor 47 couples the third coil conductor 22 and the fourth coil conductor 23.

The fourth coil conductor 23 is positioned in the same layer as one electrode layer 10 and one electrode layer 11. The fourth coil conductor 23 is away from the electrode layers 10 and 11 positioned in the same layer. The third coil conductor 22 and the fourth coil conductor 23 are adjacent to each other in the third direction D3 while the element-body layer 6 is interposed between the third coil conductor 22 and the fourth coil conductor 23. When viewed from the third direction D3, the one end of the fourth coil conductor 23 overlaps the other end of the third coil conductor 22 via the third connecting conductor 47.

The fourth connecting conductor 48 is disposed in the element-body layer 6 between the fourth coil conductor 23 and the fifth coil conductor 24. In the element-body layer 6 in which the fourth connecting conductor 48 is disposed, one electrode layer 10 and one electrode layer 11 are positioned. The fourth connecting conductor 48 is away from the electrode layers 10 and 11 positioned in the same layer. The fourth connecting conductor 48 is disposed in such a way as to overlap the other end of the fourth coil conductor 23 and one end of the fifth coil conductor 24 when viewed from the third direction D3. The fourth connecting conductor 48 is connected to the other end of the fourth coil conductor 23 and is also connected to the one end of the fifth coil conductor 24. The fourth connecting conductor 48 couples the fourth coil conductor 23 and the fifth coil conductor 24.

The fifth coil conductor 24 is positioned in the same layer as one electrode layer 10 and one electrode layer 11. When viewed from the third direction D3, the one end of the fifth coil conductor 24 overlaps the other end of the fourth coil conductor 23 via the fourth connecting conductor 48. The fifth coil conductor 24 is connected to the electrode layer 10 via a coupling conductor 26. The coupling conductor 26 is positioned in the same layer as the fifth coil conductor 24. The other end of the fifth coil conductor 24 is connected to the coupling conductor 26. The coupling conductor 26 is connected to the layer portion 10a. The coupling conductor 26 couples the fifth coil conductor 24 and the electrode layer 10. The coupling conductor 26 may be connected to the layer portion 10b. The fifth coil conductor 24 is away from the electrode layer 11 positioned in the same layer. In the present embodiment, the fifth coil conductor 24, the coupling conductor 26, and the electrode layer 10 are integrally formed.

The first coil conductor 20, the second coil conductor 21, the third coil conductor 22, the fourth coil conductor 23, and the fifth coil conductor 24 are electrically connected through the first connecting conductor 45, the second connecting conductor 46, the third connecting conductor 47, and the fourth connecting conductor 48. The first coil conductor 20, the second coil conductor 21, the third coil conductor 22, the fourth coil conductor 23, and the fifth coil conductor 24 form the coil 9 (see FIG. 4). The coil 9 is electrically connected to the terminal electrode 5 through the coupling conductor 25. The coil 9 is electrically connected to the terminal electrode 4 through the coupling conductor 26.

The coil conductors 20 to 24, the coupling conductors 25 and 26, and the connecting conductors 45 to 48 each contain a conductive material. The conductive material contains Ag or Pd. The conductive material contains, for example, metal powder, such as Ag powder or Pd powder. In the present embodiment, the coil conductors 20 to 24, the coupling conductors 25 and 26, and the connecting conductors 45 to 48 each contain the same conductive material as that of the terminal electrodes 4 and 5. The coil conductors 20 to 24, the coupling conductors 25 and 26, and the connecting conductors 45 to 48 may each contain a conductive material different from that of the terminal electrodes 4 and 5. The coil conductors 20 to 24, the coupling conductors 25 and 26, and the connecting conductors 45 to 48 are each provided in the corresponding element-body layer 6.

(Electronic-Component Manufacturing Method)

Figure 5:
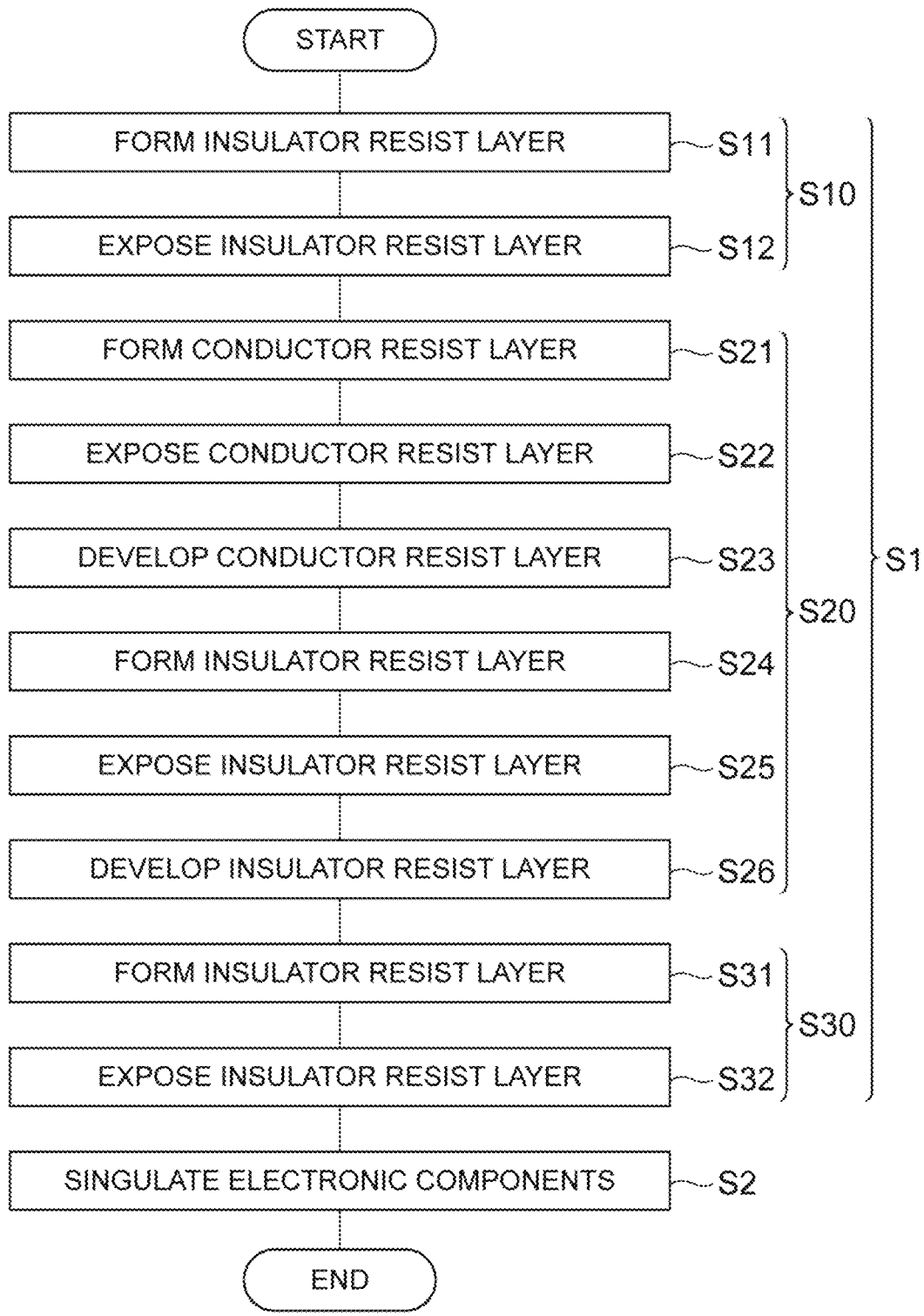
FIG. 5 is a flowchart showing an electronic-component manufacturing method according to an embodiment.

With reference to FIGS. 5, 6, 7A, 7B, 7C, 8A, 8B, 9A, 9B, 10A, 10B, 11A, 11B, 12A, 12B, 13A, 13B, 14A, and 14B, a method for manufacturing the electronic component 1 according to the embodiment is described. FIG. 5 is a flowchart showing a method for manufacturing an electronic-component according to an embodiment. FIG. 6 is a top view of a laminate substrate. FIGS. 7A to 14B are cross-sectional views for explaining a method for manufacturing an electronic-component according to an embodiment. In these drawings, sectional views along the line A-A in FIG. 6 are shown. As shown in FIGS. 5 and 6, the method for manufacturing the electronic component 1 includes a step S1 of forming a laminate substrate 30 and a step S2 of singulating a plurality of laminates L.

The step S1 is described. In the step S1, the laminate substrate 30 shown in FIG. 6 is formed. The laminate substrate 30 is formed by laminating a plurality of insulator layers 16. The laminate substrate 30 includes a plurality of laminates L disposed in the direction intersecting with the lamination direction (third direction D3) via a division portion 31. Each laminate L corresponds to the electronic component 1. Each laminate L may be the electronic component 1 directly without a firing step or may be the electronic component 1 after a firing step.

In the present embodiment, the number of laminates L is "4". The laminate substrate 30 is formed on a base material 32. The laminates L are disposed in the first direction D1 and the second direction D2 intersecting with the lamination direction when viewed from the lamination direction. The laminates L are formed in such a way as to be integrated with the division portion 31. The division portion 31 includes a division portion 31a extending in the first direction D1 and a division portion 31b extending in the second direction D2.

The division portion 31a is disposed between the laminates L adjacent in the second direction D2. The division portion 31a connects the laminates L adjacent in the second direction D2. The division portion 31a extends in the first direction D1 when viewed from the lamination direction. The division portion 31b is disposed between the laminates L adjacent in the first direction D1. The division portion 31b connects the laminates L adjacent in the first direction D1. The division portion 31b extends in the second direction D2 when viewed from the lamination direction. When viewed from the lamination direction, the division portion 31a and the division portion 31b intersect with each other (in this specification, are orthogonal to each other).

The width of the division portion 31 is, for example, 5 μm or more and 20 μm or less. The width of the division portion 31 is the length in the direction orthogonal to the extending direction of the division portion 31 when viewed from the lamination direction. That is, the width of the division portion 31a is the length of the division portion 31a in the second direction D2. The width of the division portion 31b is the length of the division portion 31b in the first direction D1. The width of the division portion 31a is, for example, equal to the width of the division portion 31b. The width of the division portion 31 may not be fixed. In this case, the minimum value of the width of the division portion 31 is, for example, 5 μm or more, and the maximum value of the width of the division portion 31 is, for example, 20 μm or less.

Each laminate L includes conductors 14 corresponding to the electrode layers 10 and 11, the coil conductors 20 to 24, the coupling conductors 25 and 26, and the connecting conductors 45 to 48 and insulator layers 16 corresponding to the element-body layers 6. The conductors 14 may be the electrode layers 10 and 11, the coil conductors 20 to 24, the coupling conductors 25 and 26, and the connecting conductors 45 to 48 directly without a firing step or may be the electrode layers 10 and 11, the coil conductors 20 to 24, the coupling conductors 25 and 26, and the connecting conductors 45 to 48 after a firing step. The insulator layers 16 may be the element-body layers 6 directly without a firing step or may be the element-body layers 6 after a firing step. In FIG. 6, the conductors 14 corresponding to the electrode layers 10 and 11 are shown, but the conductors 14 corresponding to the coil conductors 20 to 24, the coupling conductors 25 and 26, and the connecting conductors 45 to 48 are not illustrated.

In the laminate substrate 30, the conductors 14 corresponding to the electrode layers 10 and 11 are in contact with the division portion 31. In the laminates L adjacent in the first direction D1, the conductors 14 corresponding to the electrode layers 10 and 11 are alternately disposed in such a way as not to be adjacent to each other. With this disposition, the width of the division portion 31 is prevented from greatly differing depending on the position.

The step S1 shown in FIG. 5 includes a step S10 of forming a layer provided with a conductor 14 on the base material 32, a step S20 of forming a layer including the conductor 14 on the layer formed in the step S10, and a step S30 of forming a layer including no conductor 14 on the layer formed in the step S20. In the step S10, the laminate substrate 30 is formed in such a way that the width of the division portion 31 is 5 μm or more and 20 μm or less.

Figure 7A:
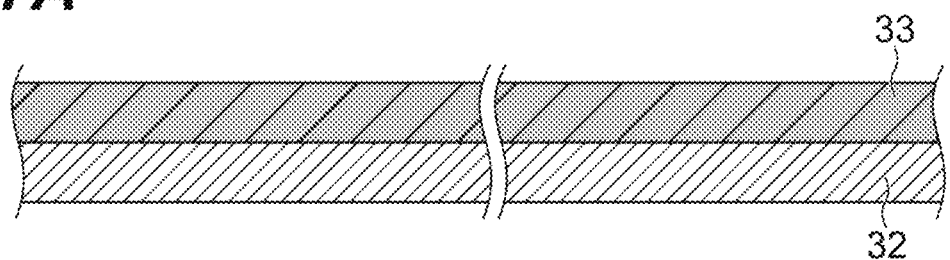
FIGS. 7A, 7B, and 7C are cross-sectional views for explaining a method for manufacturing an electronic-component according to an embodiment.

First, the step S10 is performed. In the step S10, an insulator resist layer 33 is formed on the base material 32 as shown in FIG. 7A (step S11). The insulator resist layer 33 contains an insulating material, which is a constituent material of the insulator layers 16 (that is, a constituent material of the element-body layers 6). The insulator resist layer 33 is formed by, for example, applying or printing an insulating paste containing a negative photosensitive material and the insulating material on the base material 32.

Figure 7B:
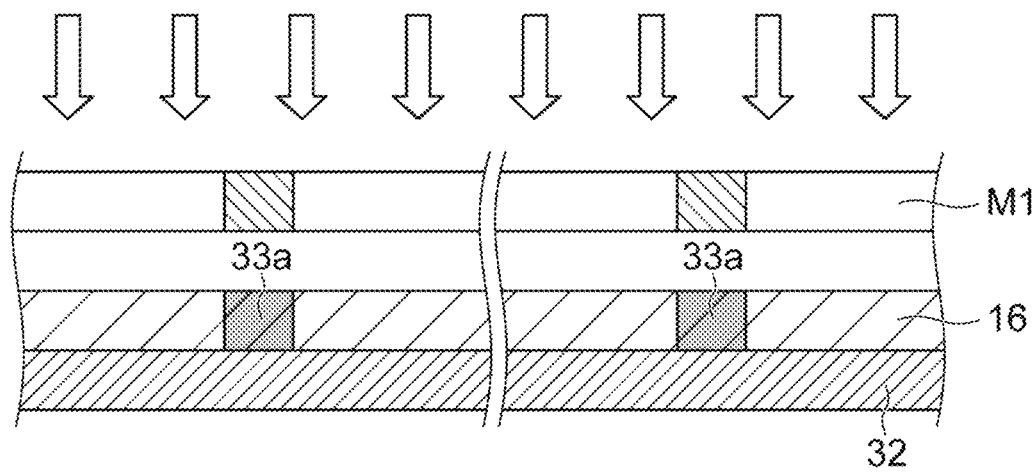

Then, the insulator resist layer 33 is exposed (step S12). Since the insulator resist layer 33 contains a negative photosensitive resin, the exposed portion is cured to form an insulator layer 16 as shown in FIG. 7B. Here, a mask M1 made of, for example, Cr is used. The mask M1 has a pattern corresponding to the shape of the division portion 31.

In the step S12, the insulator resist layer 33 is cured by exposure to form the insulator layer 16, excluding at least an insulator resist portion 33a of the insulator resist layer 33 shown in FIG. 7A. The insulator resist portion 33a corresponds to the division portion 31. In FIG. 7B, the unexposed portion that have not been exposed are shown in gray. The unexposed portion is the insulator resist portion 33a corresponding to the division portion 31. The insulator resist portion 33a forms at least a part of the division portion 31 in the lamination direction. Accordingly, a layer including the insulator layer 16 and the insulator resist portion 33a is formed on the base material 32.

Figure 7C:
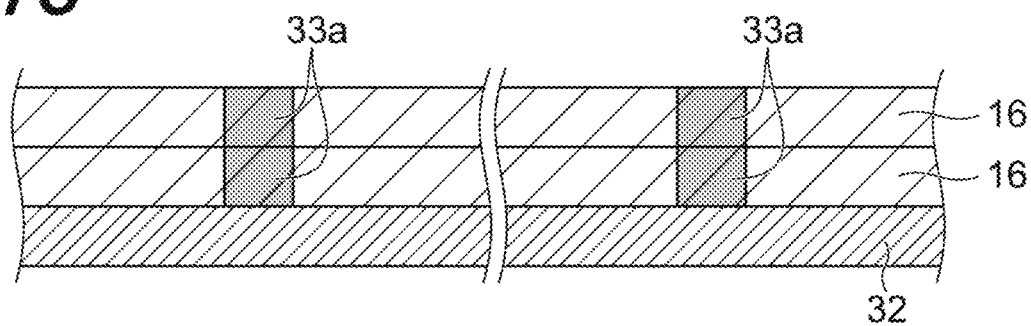

As described above, the step S10 includes the step S11 of forming an insulator resist layer 33 and the step S12 of exposing the insulator resist layer 33. In the present embodiment, the step S10 is repeated twice. Accordingly, two layers each including the insulator layer 16 and the insulator resist portion 33a are laminated on the base material 32 as shown in FIG. 7C. Note that, the step S10 may be performed only once, and only one layer including the insulator layer 16 and the insulator resist portion 33a may be laminated on the base material 32.

Figure 8A:
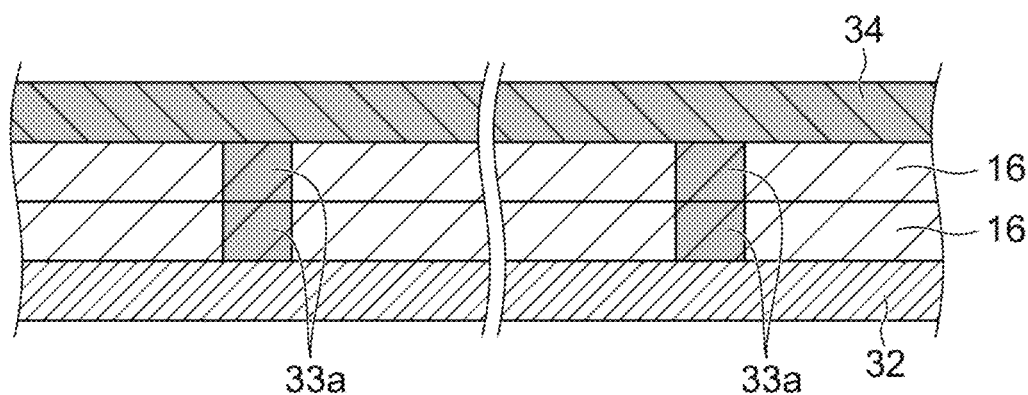
FIGS. 8A and 8B are cross-sectional views for explaining a method for manufacturing an electronic-component according to an embodiment.

Next, the step S20 is performed. Here, as the conductors 14, only the conductors 14 corresponding to the electrode layers 10 and 11 are illustrated and described. However, the conductors 14 corresponding to the coil conductors 20 to 24 and the coupling conductors 25 and 26 are similarly formed. In the step S20, a conductor resist layer 34 is formed on the layer including the insulator layer 16 and the insulator resist portion 33a formed in the step S10, as shown in FIG. 8A (step S21). The conductor resist layer 34 contains a conductive material, which is a constituent material of the conductors 14. The conductor resist layer 34 is formed by, for example, applying or printing a conductive paste containing a negative photosensitive material and the conductive material.

Figure 8B:
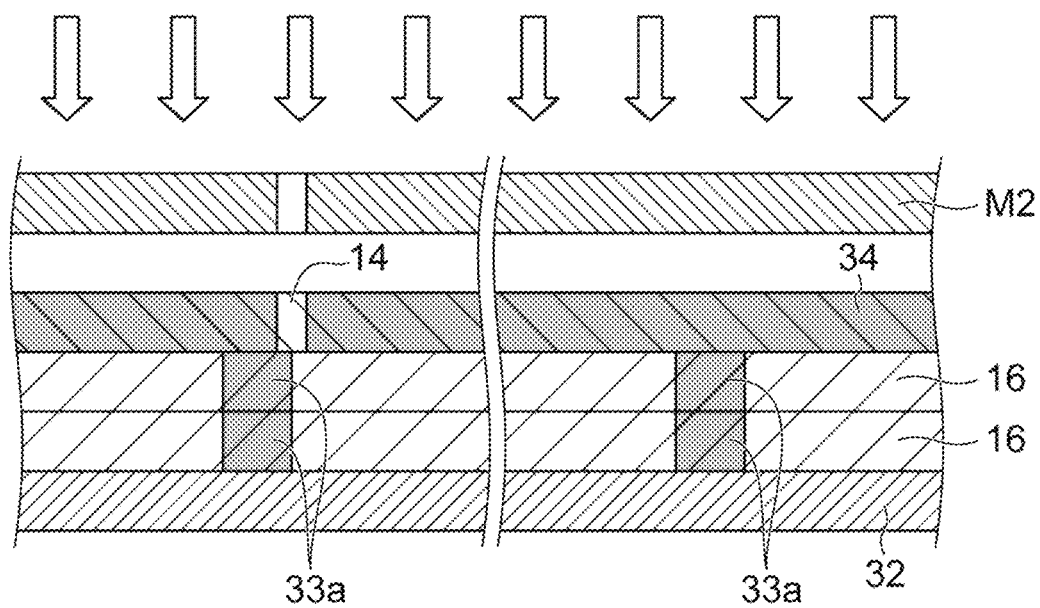

Then, the conductor resist layer 34 is exposed (step S22). Since the conductor resist layer 34 contains a negative photosensitive resin, the exposed portion is cured to form conductors 14, as shown in FIG. 8B. Here, a mask M2 made of, for example, Cr is used. The mask M2 has a pattern corresponding to the shapes of the conductors 14 to be formed. In FIG. 8B, the unexposed portion of the conductor resist layer 34 shown in FIG. 8A that have not been exposed is shown in gray. The exposure is performed by adjusting the exposure amount at which the layer positioned below the conductor resist layer 34 (on the base material 32 side) does not react.

Figure 9A:
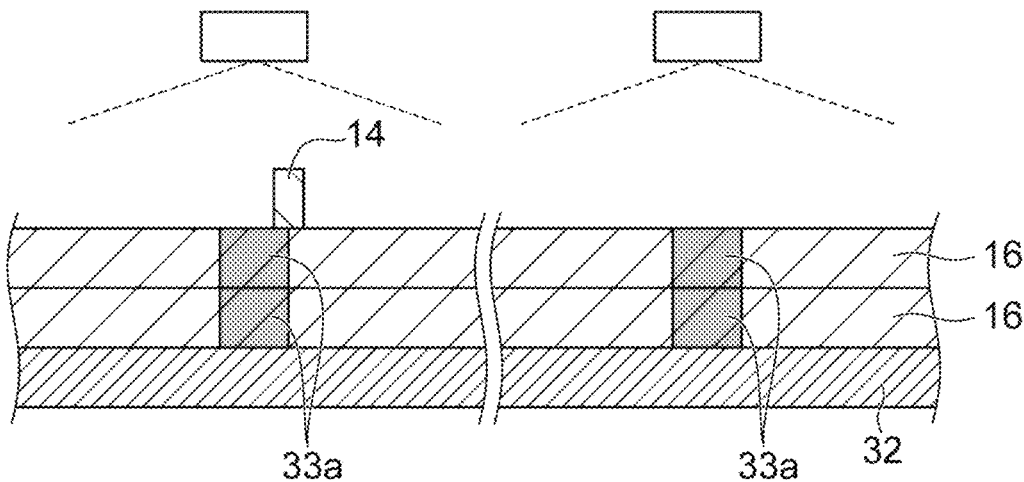
FIGS. 9A and 9B are cross-sectional views for explaining a method for manufacturing an electronic-component according to an embodiment.

Then, the conductor resist layer 34 is developed (step S23). Since the conductor resist layer 34 contains a negative photosensitive resin, the unexposed portion is dissolved in a developing solution and removed, as shown in FIG. 9A. Accordingly, the conductors 14 are formed in the step S23.

Figure 9B:
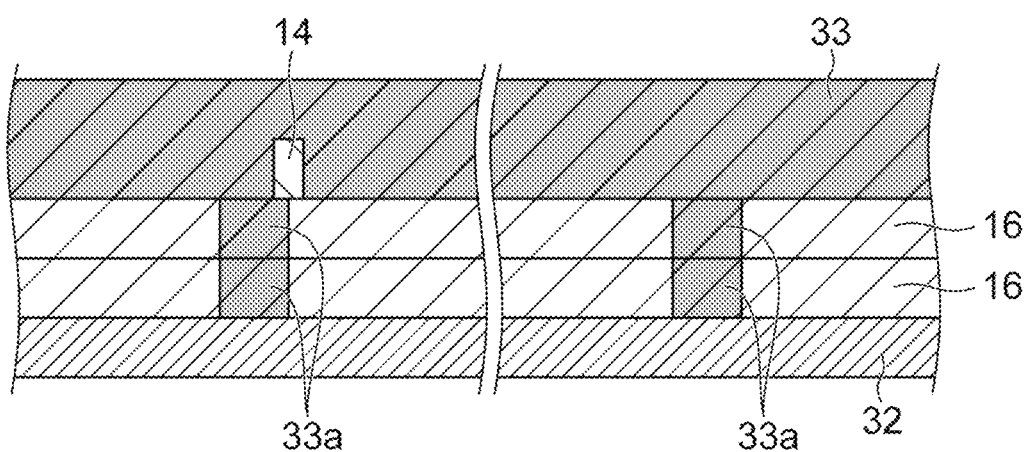

Then, an insulator resist layer 33 is formed in such a way as to embed the conductors 14, as shown in FIG. 9B (step S24). The insulator resist layer 33 is provided around the conductors 14 in such a way as to cover the conductors 14. The insulator resist layer 33 has a thickness for embedding the entire conductors 14.

Figure 10A:
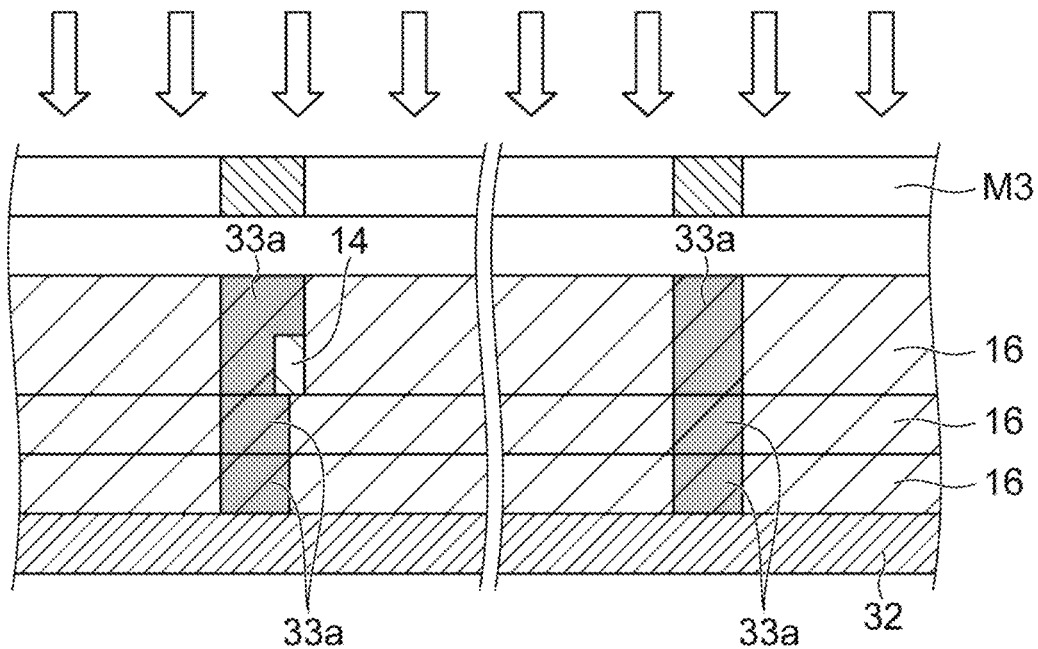
FIGS. 10A and 10B are cross-sectional views for explaining a method for manufacturing an electronic-component according to an embodiment.

Then, the insulator resist layer 33 is exposed (step S25). Since the insulator resist layer 33 contains a negative photosensitive resin, the exposed portion is cured to form an insulator layer 16, as shown in FIG. 10A. Here, a mask M3 made of, for example, Cr is used. The mask M3 has a pattern corresponding to the shapes of the division portion 31 and the conductors 14. The unexposed portion is the insulator resist portion 33a corresponding to the division portion 31 and the conductors 14.

Figure 10B:
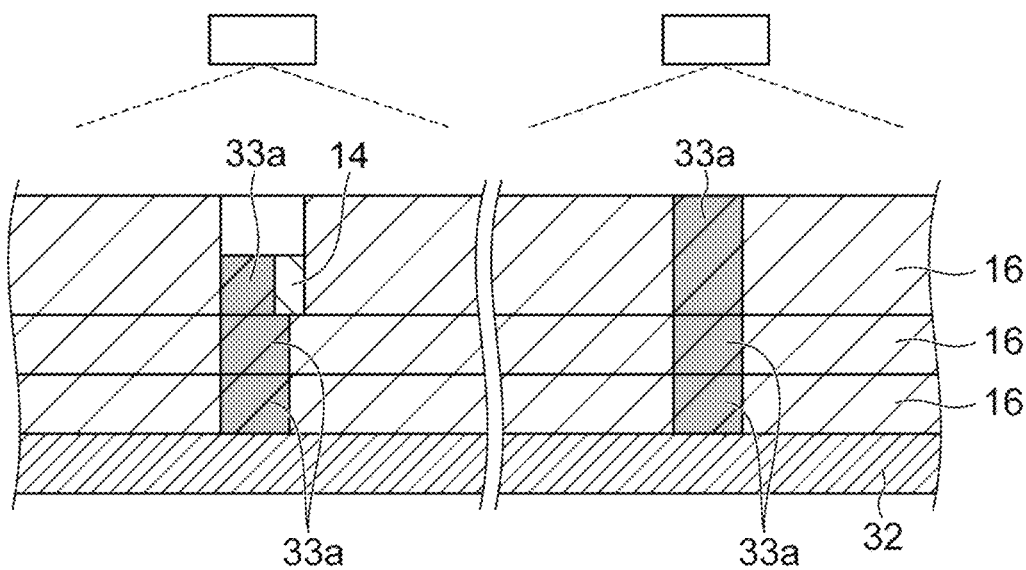

Then, the insulator resist layer 33 is developed (step S26). Since the insulator resist layer 33 contains a negative photosensitive resin, the unexposed portion can be dissolved in a developing solution and removed. Here, as shown in FIG. 10B, a development process is performed by being adjusted in such a way that the insulator resist portion 33a having a predetermined width or less is not removed and that the insulator resist portion 33a exceeding the predetermined width is removed. Specifically, the adjustment of the developing process is performed by adjusting the pressure of the nozzle for ejecting the developing solution, the developing temperature, the developing time, or the like. Accordingly, depressions (via) for exposing the lower-layer conductors 14 are formed in the insulator layer 16.

As described above, the step S20 includes the step S21 of forming a conductor resist layer 34, the step S22 of exposing the conductor resist layer 34, the step S23 of developing the conductor resist layer 34, the step S24 of forming an insulator resist layer 33, the step S25 of exposing the insulator resist layer 33, and the step S26 of developing the insulator resist layer 33. In the present embodiment, the step S20 is repeated. With the first step S20, the layer including the insulator layer 16, the conductor 14, and the insulator resist portion 33a is laminated on the layer formed in the step S10, as shown in FIG. 10B.

Figure 11A:
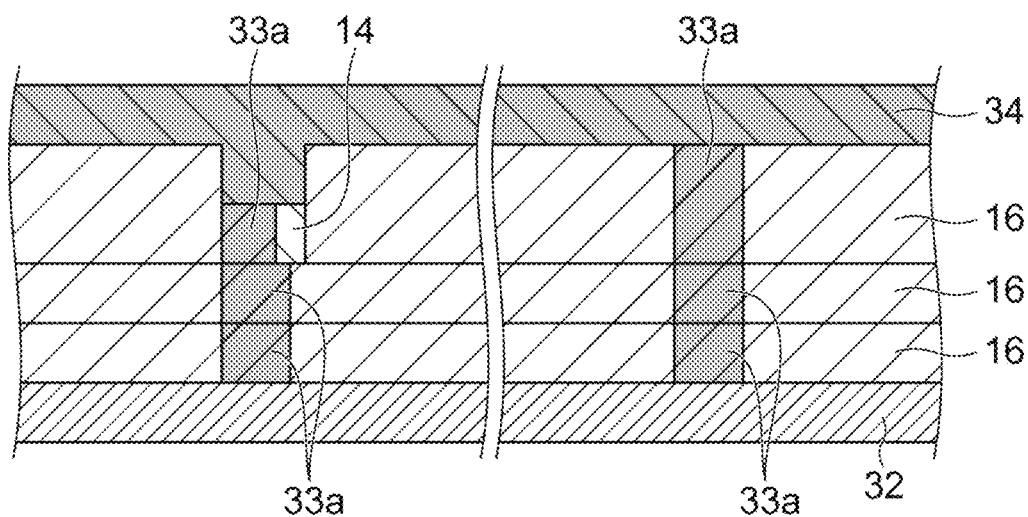
FIGS. 11A and 11B are cross-sectional views for explaining a method for manufacturing an electronic-component according to an embodiment.

The second and subsequent step S20 is described. Here, as the conductors 14, only the conductors 14 corresponding to the electrode layers 10 and 11 are illustrated and described. However, the conductors 14 corresponding to the coil conductors 20 to 24, the coupling conductors 25 and 26, and the connecting conductors 45 to 48 are similarly formed. First, as shown in FIG. 11A, a conductor resist layer 34 is formed on the insulator layer 16 formed in the previous step S20 (step S21). The depressions formed in the previous step S20 are filled with the conductor resist layer 34.

Figure 11B:
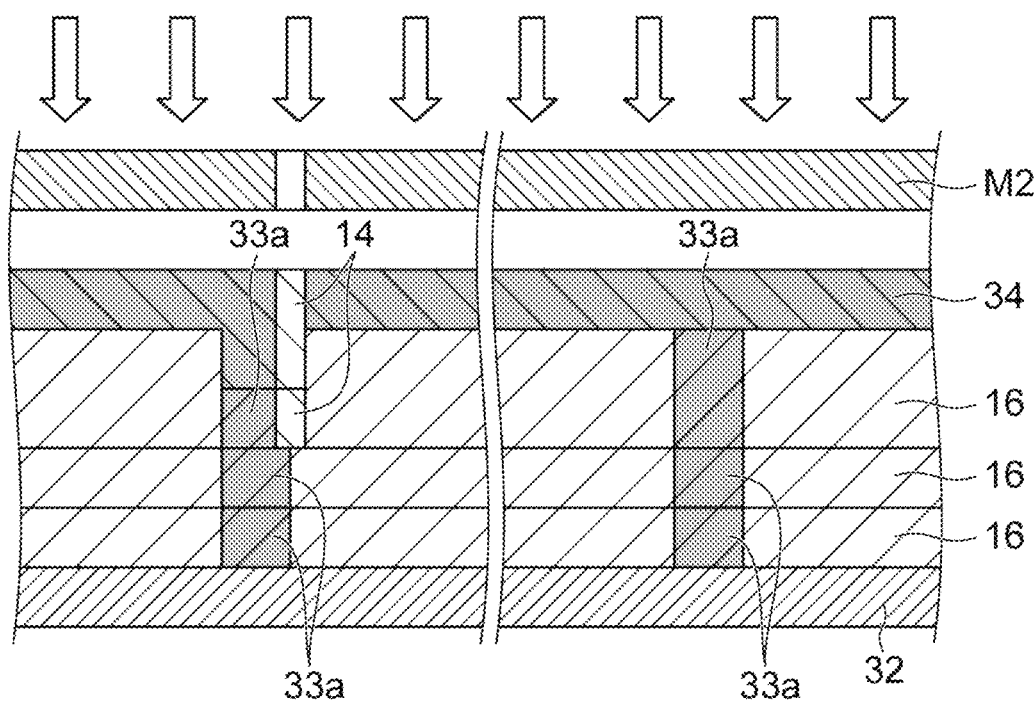

Then, the conductor resist layer 34 is exposed (step S22). The exposed portion is cured to form conductors 14, as shown in FIG. 11B. The conductors 14 formed in the depressions correspond to a part of the electrode layers 10 and 11, and the connecting conductors 45 to 48.

Figure 12A:
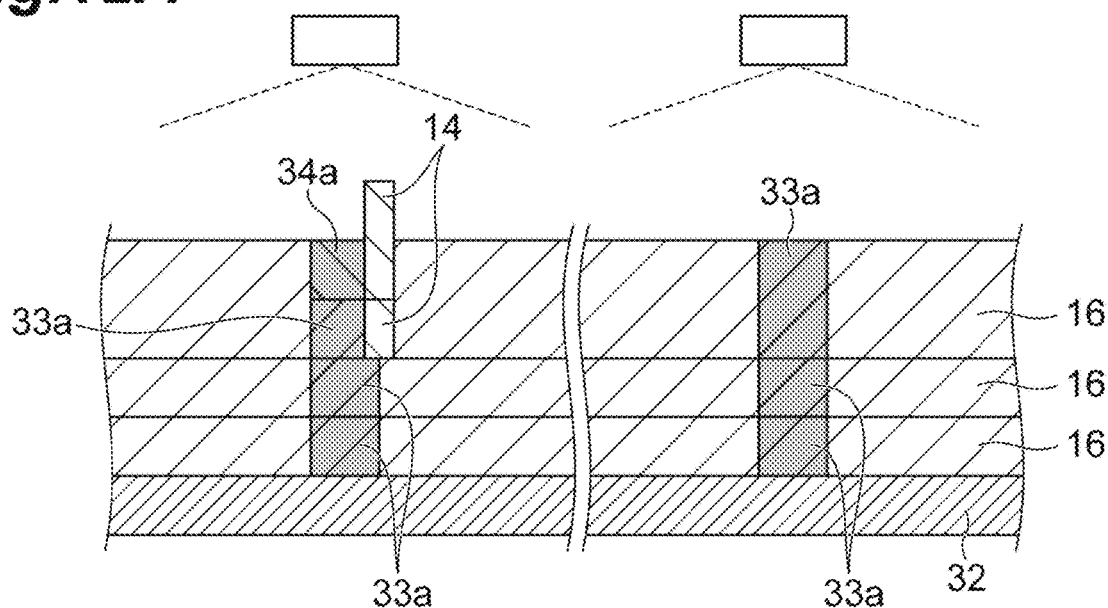
FIGS. 12A and 12B are cross-sectional views for explaining a method for manufacturing an electronic-component according to an embodiment.

Then, the conductor resist layer 34 is developed (step S23). Also in this step, a development process is performed by being adjusted in such a way that an insulator resist portion 33a and a conductor resist portion 34a that have a predetermined width or less are not removed and that the insulator resist portion 33a and the conductor resist portion 34a that exceed the predetermined width are removed. Accordingly, the insulator resist portion 33a and the conductor resist portion 34a corresponding to the division portion 31 are not removed but remain, as shown in FIG. 12A. The conductors 14 each have a protrusion portion protruding from the upper surface of the insulator layer 16.

Figure 12B:
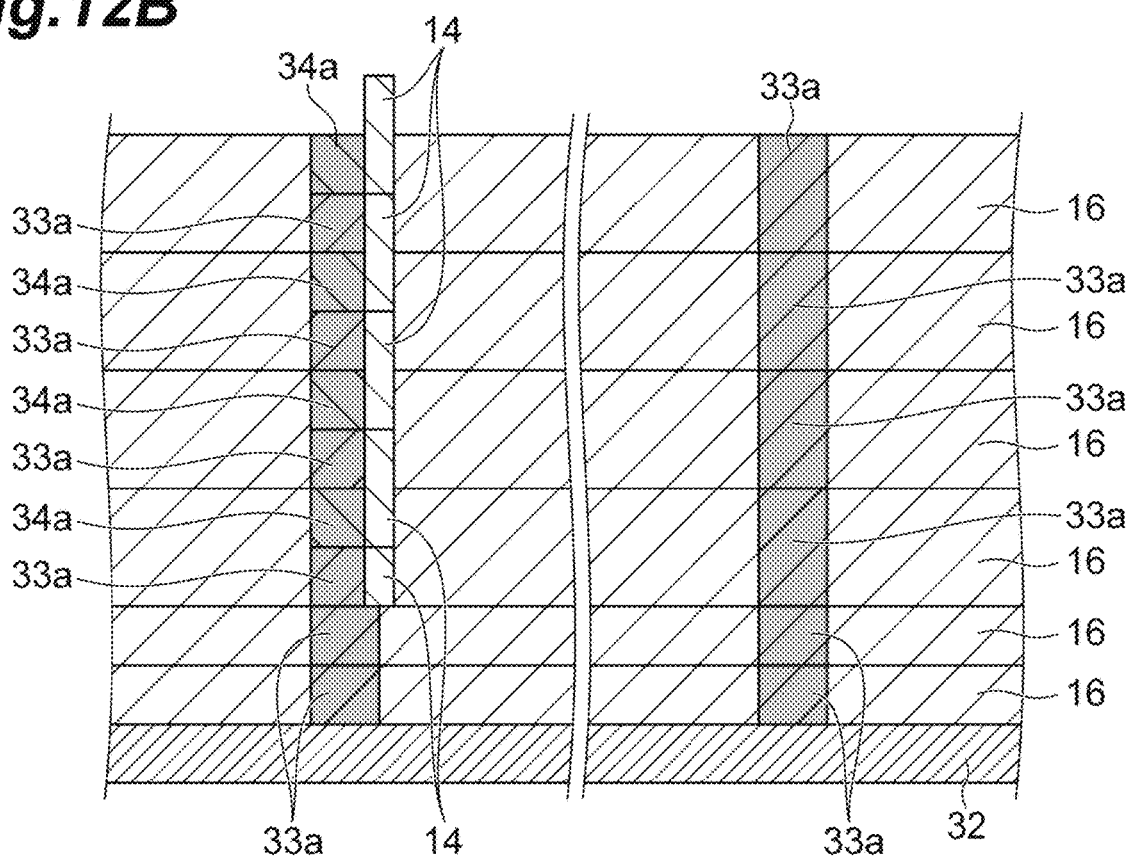

As described above, with the second and subsequent step S20, the layer including the insulator layer 16, the conductors 14, the insulator resist portion 33a, and the conductor resist portion 34a is laminated on the layer formed in the previous step S20. By repeating the step S20 a plurality of times, a plurality of layers each including the insulator layer 16, the conductors 14, the insulator resist portion 33a, and the conductor resist portion 34a is laminated, as shown in FIG. 12B.

In the division portion 31 in contact with the conductors 14, the insulator resist portion 33a and the conductor resist portion 34a are alternately laminated. In the division portion 31 away from the conductors 14, the insulator resist portion 33a is laminated.

Figure 13A:
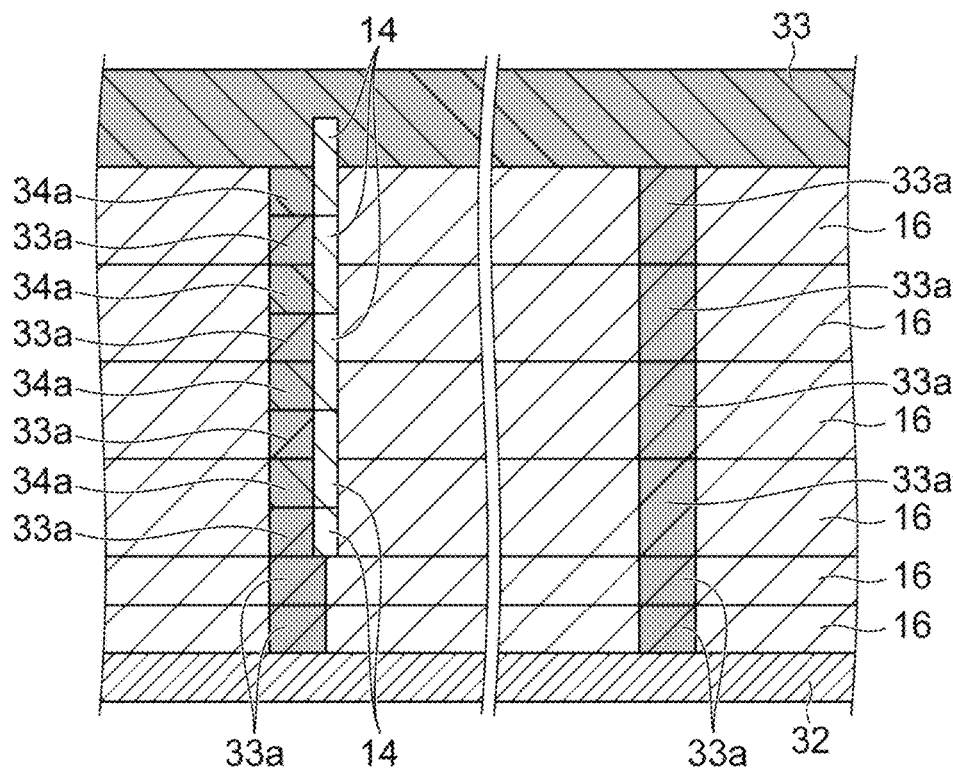
FIGS. 13A and 13B are cross-sectional views for explaining a method for manufacturing an electronic-component according to an embodiment.
Figure 13B:
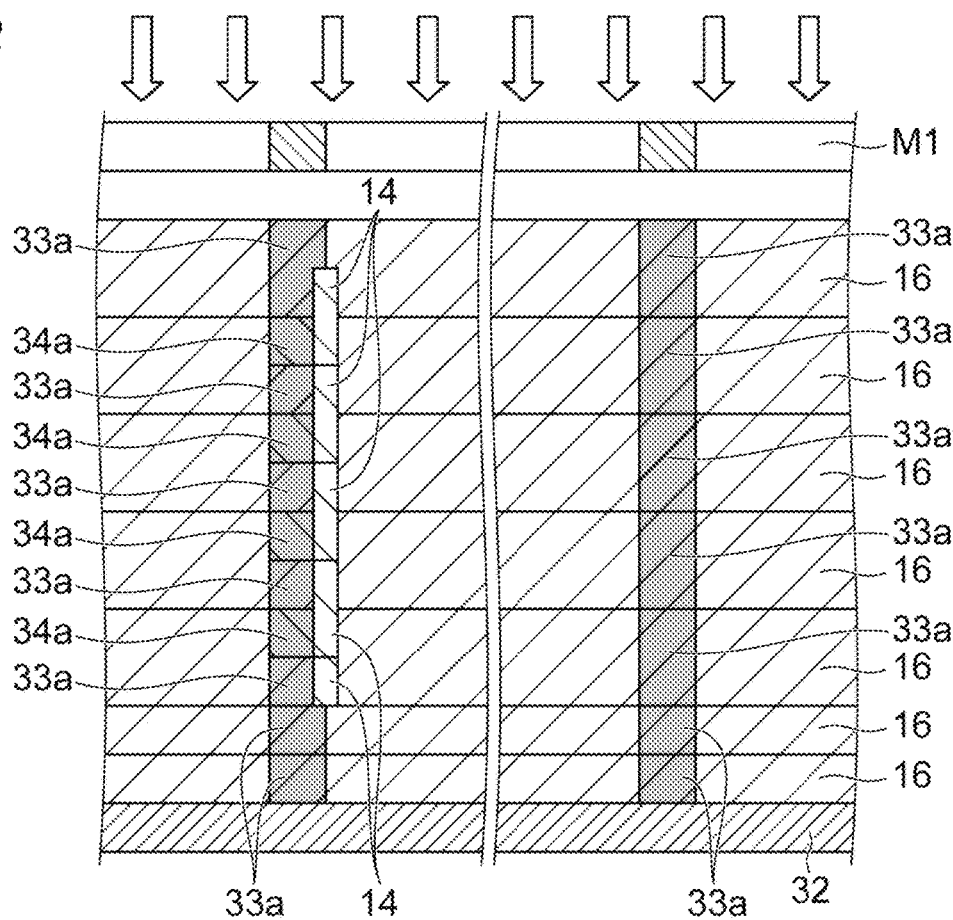

Then, the step S30 is performed. In the step S30, an insulator resist layer 33 is firstly formed, as shown in FIG. 13A (step S31). The insulator resist layer 33 has a thickness for embedding the protruding portions of the conductors 14. Then, the insulator resist layer 33 is exposed (step S32). Accordingly, the exposed portion is cured to form an insulator layer 16, as shown in FIG. 13B. Here, a mask M1 made of, for example, Cr is used. In the present embodiment, the step S30 is performed twice. Accordingly, two layers each including the insulator layer 16 and the insulator resist portion 33a are laminated on the layer formed in the step S20. As a result, the laminate substrate 30 is formed.

The laminate substrate 30 is formed by laminating a plurality of insulator layers 16 in the step S1. It can be said that the laminate substrate 30 is formed by repeating, in the step S1, the step of forming an insulator resist layer 33 (that is, the step S11, step S24, or step S31) and the step of forming an insulator layer 16 on the base material 32 (that is, the step S12, step S25, or step S32).

Figure 14A:
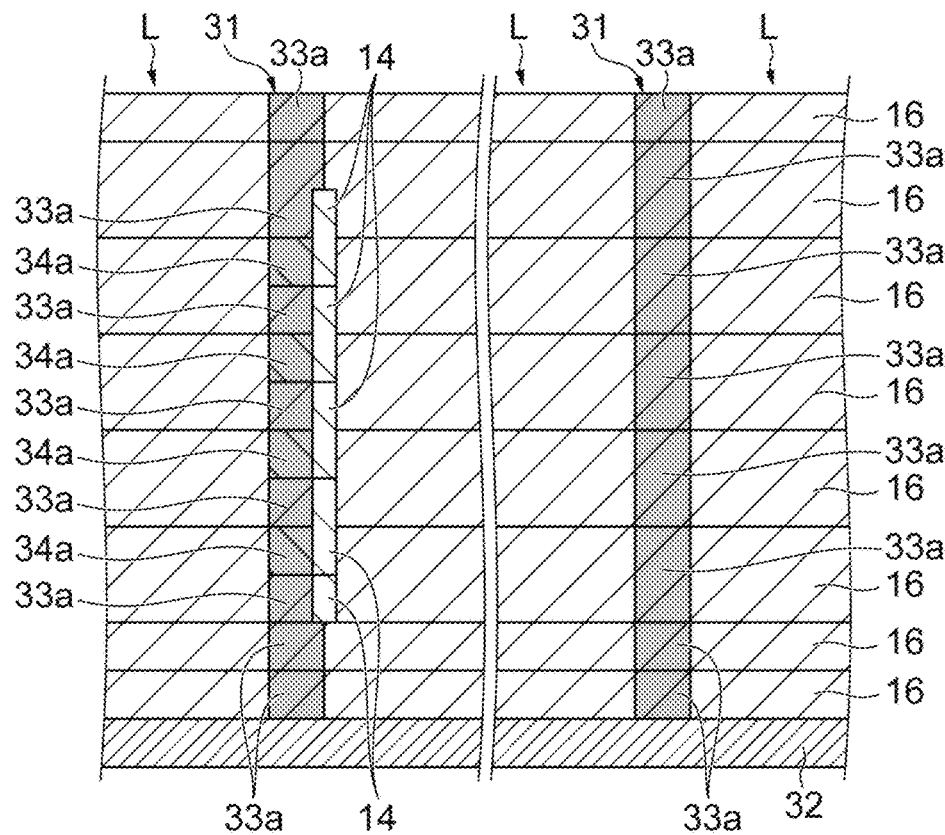
FIGS. 14A and 14B are cross-sectional views for explaining a method for manufacturing an electronic-component according to an embodiment.
Figure 14B:
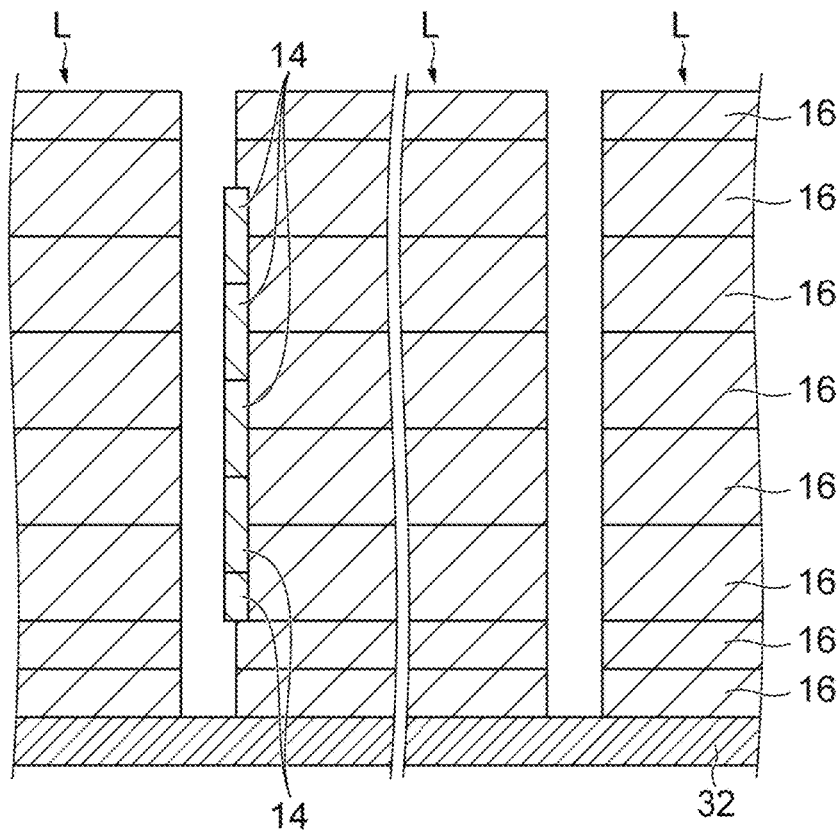

After the step S1, the step S2 of singulating a plurality of laminates L is performed by removing the division portion 31 (see FIG. 14A), as shown in FIG. 14B. In the step S2, a developing process adjusted in such a way that the division portion 31 is removed is performed, as shown in FIG. 14B. Accordingly, the laminates L are away from each other on the base material 32. Then, the laminates L are peeled from the base material 32. Accordingly, the singulated laminates L are formed. Each singulated laminate L obtained in the step S2 may be the electronic component 1 directly without a firing step or may be the electronic component 1 after a firing step as described above.

The effects of the method for manufacturing the electronic component 1 are described below. Since the laminates L are each provided with the conductors 14 in contact with the division portion 31, when, for example, the laminate substrate 30 is cut for dicing, a large cutting stress is applied to the laminate substrate 30 because the conductors 14 are difficult to cut. As a result, the laminates L can be deformed. On the other hand, in the method for manufacturing the electronic component 1, the division portion 31 of the laminate substrate 30 is removed by development, and the laminates L are singulated. Thus, the deformation of the laminates L is further suppressed as compared with the case of dicing.

For example, when the insulator resist portion 33a is removed immediately after the step S12, depressions are formed between the insulator layers, and the planarity of the insulator resist layer 33 laminated thereon can be deteriorated. Since the depressions become deeper as the number of laminated insulator layers 16 is increased, the planarity of the insulator resist layer 33 laminated thereon is easily deteriorated. As a result, the shapes of the laminates L are easily deteriorated. Specifically, the side portion of each laminate L on the side opposite to the base material 32 is easily rounded. In the method for manufacturing the electronic component 1, a plurality of insulator layers 16 is laminated and the laminate substrate 30 is formed in the step S1, and, then, the division portion 31 including the insulator resist portion 33a is removed in the step S2. Thus, the deterioration of the planarity of the laminated insulator resist layer 33 is suppressed. As a result, the deterioration of the shapes of the laminates L is suppressed.

In the step S1 of forming the laminate substrate 30, the laminate substrate 30 is formed in such a way that the width of the division portion 31 is 5 µm or more and 20 µm or less. Since the width of the division portion 31 is 5 µm or more, it is possible to singulate the laminates L by removing the insulator resist portion 33a and the conductor resist portion 34a corresponding to the division portion 31 in the adjusted development process. Since the width of the division portion 31 is 20 µm or less, it is possible to reduce the contact areas of the insulator resist portion 33a and the conductor resist portion 34a with a developing solution although the insulator resist portion 33a and the conductor resist portion 34a are immersed in the developing solution in forming the laminate substrate 30. Thus, it is possible to suppress removing of the insulator resist portion 33a and the conductor resist portion 34a in the adjusted development process in forming the laminate substrate 30.

The step S1 of forming the laminate substrate 30 includes the step S21 of forming the conductor resist layer 34 containing a conductive material that is a constituent material of the conductors 14 provided in the laminates L, the step S22 and the step S23 of forming the conductors 14 from the conductor resist layer 34 by exposure and development. In the step S24 of forming the insulator resist layer 33, the insulator resist layer 33 is formed in such a way as to embed the conductors 14. Accordingly, it is possible to provide the conductors 14 in the laminates L.

The embodiment of the present invention has been described above; the present invention is not necessarily limited to the above described embodiment, and can be variously changed without departing from the gist.

In the electronic component 1, the terminal electrodes 4 and 5 may not include the electrode portions 42 and 52 protruding from the depressions 7 and 8. In this case, the surfaces of the terminal electrodes 4 and 5 align with the end faces 2a and 2b and the main face 2c.

In the electronic component 1, the terminal electrodes 4 and 5 are provided in the depressions 7 and 8 of the element body 2, but the terminal electrodes 4 and 5 may be provided in, for example, the end faces 2a and 2b. In this case, the terminal electrodes 4 and 5 are formed by, for example, firing a conductive paste applied to the end faces 2a and 2b. Thus, the conductors in the layer formed in the step S20 do not include the electrode layers 10 and 11.

In the laminate substrate 30, the laminates L may be disposed in such a way that the conductors 14 corresponding to the electrode layers 10 and 11 are adjacent to each other via the division portion 31.

What is claimed is:

1. A method for manufacturing an electronic-component, the method comprising steps of:
   forming a laminate substrate including a plurality of laminates disposed in a direction intersecting with a lamination direction via a division portion by laminating a plurality of insulator layers; and
   singulating the plurality of laminates by removing the division portion, wherein
   the forming the laminate substrate further comprising:
   forming an insulator resist layer containing an insulating material on a base material, the insulating material being a constituent material of each of the plurality of insulator layers;
   forming one of the plurality of insulator layers by curing the insulator resist layer by exposure, except for at least an insulator resist portion corresponding to the division portion; and
   repeating, on the base material, the forming the insulator resist layer and the forming the one of the plurality insulator layers; and
   the removing the division portion including removing the insulator resist portion during the singulating.

2. The method for manufacturing the electronic-component according to claim 1, wherein
   in the forming the laminate substrate, the laminate substrate is formed in such a way that the division portion has a width of 5 µm or more and 20 µm or less.

3. The method for manufacturing the electronic-component according to claim 1, wherein
   the forming the laminate substrate further comprising:
   forming a conductor resist layer containing a conductive material, the conductive material being a constituent material of a conductor provided in each of the plurality of laminates; and forming the conductor from the conductor resist layer by exposure and development, and in the forming the insulator resist layer, the insulator resist layer is formed in such a way as to embed the conductor.

4. The method for manufacturing the electronic-component according to claim 3 wherein each of the laminates includes at least a pair of faces that are adjacent to each other, and the conductor is disposed on the pair of faces.

5. The method for manufacturing the electronic-component according to claim 3, wherein the forming the laminate substrate further comprising disposing a coil in each of plurality of laminates, and the conductor is connected to the disposed coil.

6. The method for manufacturing the electronic-component according to claim 1, wherein the forming the laminate substrate further comprising disposing a coil in each of plurality of laminates.

7. The method for manufacturing the electronic-component according to claim 6, wherein the disposed coil includes an axis extending along the lamination direction.

\* \* \* \* \*